US006803636B2

United States Patent
Ibara et al.

(10) Patent No.: US 6,803,636 B2
(45) Date of Patent: Oct. 12, 2004

(54) SEMICONDUCTOR DEVICE HAVING SILICIDE FILMS

(75) Inventors: Yoshikazu Ibara, Motosu-gun (JP); Atsuhiro Nishida, Oogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/243,744

(22) Filed: Sep. 16, 2002

(65) Prior Publication Data
US 2003/0052372 A1 Mar. 20, 2003

(30) Foreign Application Priority Data

Sep. 18, 2001 (JP) .......... 2001-283243
Aug. 2, 2002 (JP) .......... 2002-225635

(51) Int. Cl.$^7$ .............. H01L 29/76
(52) U.S. Cl. .......... 257/412; 257/382; 257/383; 257/384; 257/288; 257/388
(58) Field of Search .............. 257/288, 368, 257/372, 377, 382, 383, 384, 385, 388, 412, 413, 454, 455, 456, 486, 576, 759, 755, 756, 757, 768, 769, 770

(56) References Cited

U.S. PATENT DOCUMENTS 4,874,714 A * 10/1989 Eklund
6,271,075 B1 * 8/2001 Fukui
6,281,118 B1 * 8/2001 Park
6,287,913 B1 * 9/2001 Agnello et al.
6,333,222 B1 * 12/2001 Kitazawa et al.
6,376,372 B1    4/2002 Paranjpe et al.

FOREIGN PATENT DOCUMENTS

| JP | 8-330253  |   | 12/1996 |
| JP | 11-40679  | * | 2/1999  |
| JP | 11-111616 |   | 4/1999  |
| JP | 2000-22150|   | 1/2000  |

* cited by examiner

Primary Examiner—Nathan J. Flynn
Assistant Examiner—Kevin Quinto
(74) Attorney, Agent, or Firm—McDermott Will & Emery LLP

(57) ABSTRACT

A semiconductor device capable of easily setting the sheet resistance of a resistive element or the like to an arbitrary value is obtained. This semiconductor device comprises a first silicide film formed on a first silicon region and a second silicide film, formed on a second silicon region, consisting of the same silicide material as the first silicide film and differing from the first silicide film in film quality to have a sheet resistance value different from that of the first silicide film. When an impurity is introduced into the second silicide film itself so that the second silicide film differs from the first silicide film in film quality in this case, for example, a second silicide film having an arbitrary high sheet resistance value can be obtained by controlling the type of and an introduction condition for the impurity.

9 Claims, 19 Drawing Sheets

| IONIC SPECIES | ACCELERATION ε (keV) | DOSE(cm-2) |
|---|---|---|
| As+ | 45 | 2E15 |
| P+ | 25 | 2E15 |
| B+ | 10 | 2E15 |
| BF2+ | 40 | 2E15 |
| Rp SET TO 30nm in Si | | |

SEMICONDUCTOR DEVICE HAVING SILICIDE FILMS

BACKGROUND OF THE INVENTION

1. Field of the Invention

The present invention relates to a semiconductor device and a method of fabricating a semiconductor device, and more particularly, it relates to a semiconductor device having silicide films and a method of fabricating a semiconductor device.

2. Description of the Background Art

Following recent requirements for refinement and high-speed operation of a semiconductor device, various techniques have been developed for reducing the resistance values of a gate electrode and a source/drain electrode of a transistor. As one of such techniques, a salicide (self-aligned silicide) technique of silicifying the upper portions of the gate electrode and the source/drain electrode of the transistor in a self-aligned manner is put into practice.

When the salicide technique is applied to an analog device having a capacitive element and a resistive element, however, the upper portion of a polycrystalline silicon film for the resistive element is also silicified and hence the resistance of the resistive element is disadvantageously reduced to about 2 to 5 $\Omega$/. Further, a gate oxide film must be prevented from breakdown resulting from static electricity not only in the analog device but also in an input/output circuit part of a semiconductor device, for example. In general, therefore, the resistance of a high-concentration impurity diffusion layer of a source/drain region is set relatively high. When the salicide technique is applied to the semiconductor device having such an input/output circuit part, however, the upper portion of the high-concentration impurity diffusion layer of the source/drain region is also silicified and hence the resistance thereof is disadvantageously reduced.

In relation to this problem, Japanese Patent Laying-Open No. 2000-22150, for example, proposes a technique of preventing regions such as an input/output part and a resistance part requiring high resistance from silicification in a salicide process.

In general, the sheet resistance of an unsilicified silicon region is decided by impurity implantation conditions and heat treatment conditions for forming a transistor. In other words, the unsilicified silicon region can have a sheet resistance value in the range of the same value as that of a diffusion layer formed with the highest impurity concentration and the same value as that of a well region formed with the lowest impurity concentration. Further, the sheet resistance value of the unsilicified silicon region depends on the impurity concentration decided by combining impurity implantation conditions in the aforementioned range. In other words, the sheet resistance of the unsilicified silicon region must be generally decided by controlling the impurity implantation conditions for forming the transistor thereby controlling the impurity concentration.

Following recent diversification of the analog device mounted on a semiconductor device, however, extension of the degree of freedom in design is hindered if the sheet resistance value of the unsilicified silicon region is decided by the impurity implantation conditions employed for forming the transistor. Particularly when resistivity values and resistance values are previously decided in the stage of design for forming a device corresponding thereto with regulation in the stage of fabrication, the resistance value of the unsilicified silicon region must be arbitrarily decidable in the range of about 4 $\Omega$/ for a general low-resistance silicide region to about 1000 $\Omega$/ for a high-resistance silicide region in formation of the transistor.

SUMMARY OF THE INVENTION

An object of the present invention is to provide a semiconductor device capable of easily setting the resistance of a resistive element or the like to an arbitrary value without controlling an impurity implantation condition in formation of a transistor or the like.

Another object of the present invention is to provide a method of fabricating a semiconductor device capable of easily setting the sheet resistance of a resistive element or the like to an arbitrary value without controlling an impurity implantation condition in formation of a transistor or the like.

In order to attain the aforementioned objects, a semiconductor device according to a first aspect of the present invention comprises a first silicide film formed on a first silicon region and a second silicide film, formed on a second silicon region, consisting of the same silicide material as the first silicide film and differing from the first silicide film in film quality to have a sheet resistance value different from that of the first silicide film.

In the semiconductor device according to the first aspect, as hereinabove described, the second silicide film consisting of the same silicide material as the first silicide film and differing from the first silicide film in film quality to have a sheet resistance value different from that of the first silicide film is so provided that a silicide film having a low sheet resistance value and a silicide film having a high sheet resistance value can be easily obtained. When an impurity is introduced into the second silicide film itself so that the second silicide film differs from the first silicide film in film quality in this case, for example, a second silicide film having an arbitrary high sheet resistance value can be obtained by controlling the type of and the introduction condition for the impurity. Thus, the sheet resistance of a resistive element or the like can be easily set to an arbitrary value without controlling an impurity injection condition in formation of a transistor or the like. Consequently, the degree of freedom in design can be extended.

In the aforementioned semiconductor device according to the first aspect, the second silicide film preferably differs from the first silicide film in film quality due to introduction of an impurity, to have a higher sheet resistance value than the first silicide film. According to this structure, a second silicide film having an arbitrary high sheet resistance value can be easily obtained by controlling the type of and the introduction condition for the impurity.

A semiconductor device according to a second aspect of the present invention comprises a first silicon region and a second silicon region, a first silicide film formed on the first silicon region and a metal layer, formed on the second silicon region, having a sheet resistance value different from that of the first silicide film.

In the semiconductor device according to the second aspect, as hereinabove described, the first silicide film formed on the first silicon region and the metal layer, formed on the second silicon region, having the sheet resistance value different from that of the first silicide film are so provided that a silicide film or a metal layer having a low sheet resistance value and a metal layer or a silicide film having a high sheet resistance value can be easily obtained.

In this case, the sheet resistance values of the first silicide film and the metal layer can be easily controlled to prescribed values by controlling the materials for and the thicknesses of the first silicide film and the metal layer, for example. Thus, the sheet resistance value of a resistive element or the like can be easily set to an arbitrary value without controlling an impurity implantation condition for forming a transistor or the like. Consequently, the degree of freedom in design can be extended.

In the aforementioned semiconductor device according to the second aspect, the first silicon region and the second silicon region may consist of the same silicon layer.

A semiconductor device according to a third aspect of the present invention comprises a silicon region and a silicide film, formed on the silicon region, deteriorated in crystallinity to be increased in sheet resistance.

In the semiconductor device according to the third aspect, as hereinabove described, the silicide film deteriorated in crystallinity to be increased in sheet resistance is so provided that a silicide film having a high sheet resistance value can be easily obtained. Thus, a resistive element or the like requiring a high sheet resistance value can be easily formed by the silicide film.

In the aforementioned semiconductor device according to the third aspect, the silicide film is preferably deteriorated in crystallinity due to introduction of an impurity. According to this structure, a silicide film having an arbitrary high sheet resistance value can be obtained by controlling the type of and the introduction condition for the impurity. Thus, the sheet resistance value of a resistive element or the like can be easily set to an arbitrary value. Consequently, the degree of freedom in design can be extended. In this case, the silicide film is preferably converted to an amorphous state due to introduction of the impurity. Further, the impurity may include at least one element selected from a group consisting of Ge, Si, B, As, P and $BF_2$. In addition, the silicide film may contain Co.

A method of fabricating a semiconductor device according to a fourth aspect of the present invention comprises steps of forming a first silicon region and a second silicon region, forming a first silicide film on the first silicon region while forming a second silicide film consisting of the same silicide material as the first silicide film on the second silicon region through a first salicide process, forming a reaction inhibition film to cover the second silicide film, and forming a third silicide film consisting of the same silicide material as the first silicide film on the first silicide film provided on the first silicon region through a second salicide process.

In the method of fabricating a semiconductor device according to the fourth aspect, as hereinabove described, the reaction inhibition film is formed to cover the second silicide film and thereafter the third silicide film consisting of the same silicide material as the first silicide film is formed on the first silicide film provided on the first silicon region through the second salicide process, whereby a thick silicide film can be formed on the first silicon region by stacking the first and third silicide films. In this case, the sheet resistance value of the multilayer film formed by the first and third silicide films and that of the second silicide film can be easily controlled to prescribed values respectively by controlling the thicknesses of the first, second and third silicide films. Thus, the resistance value of a part (the region formed with the second silicide film) such as a resistive element requiring a high sheet resistance value can be easily set to an arbitrary value without controlling an impurity implantation condition for forming a transistor or the like. Consequently, the degree of freedom in design can be extended.

A method of fabricating a semiconductor device according to a fifth aspect of the present invention comprises steps of forming a first silicon region and a second silicon region, forming a first silicide film on the first silicon region while forming a second silicide film on the second silicon region through a first salicide process, forming a reaction inhibition film and an etching mask to cover the second silicide film, removing the first silicide film by etching through the etching mask, and forming a third silicide film on the first silicon region through a second salicide process.

In the method of fabricating a semiconductor device according to the fifth aspect, as hereinabove described, the reaction inhibition film and the etching mask are formed to cover the second silicide film for thereafter removing the first silicide film by etching through the etching mask and forming the third silicide film on the first silicon region through the second salicide process, whereby a third silicide film having a larger thickness or a smaller sheet resistance than the second silicide film can be formed on the first silicon region. In this case, the sheet resistance values of the second and third silicide films can be easily controlled to prescribed values respectively by controlling the thicknesses of the second and third silicide films, for example. Thus, the resistance value of a part (the region formed with the second silicide film) such as a resistive element requiring a high sheet resistance value can be easily set to an arbitrary vale without controlling the impurity implantation condition for forming a transistor or the like. Consequently, the degree of freedom in design can be extended.

In the aforementioned method of fabricating a semiconductor device according to the fifth aspect, the step of forming the third silicide film preferably includes a step of forming the third silicide film consisting of the same silicide material as the second silicide film and having a larger thickness than the second silicide film on the first silicon region. According to this structure, a third suicide film having an arbitrary low sheet resistance value and a second silicide film having an arbitrary high sheet resistance value can be easily formed.

A method of fabricating a semiconductor device according to a sixth aspect of the present invention comprises steps of forming a first silicon region and a second silicon region, forming a first silicide film on the first silicon region while forming a second silicide film on the second silicon region through a first salicide process, forming an etching mask to cover the first silicide film, and etching the second silicide film by a prescribed thickness through the etching mask.

In the method of fabricating a semiconductor device according to the sixth aspect, as hereinabove described, the etching mask is formed to cover the first silicide film for thereafter etching the second silicide film by a prescribed thickness through the etching mask, whereby the sheet resistance value of the second silicide film can be easily increased beyond that of the first silicide film. In this case, the sheet resistance value of the second silicide film can be controlled to a prescribed value by controlling the quantity of etching of the second silicide film. Thus, the resistance value of a part (the region formed with the second silicide film) such as a resistive element requiring a high sheet resistance value can be easily set to an arbitrary value without controlling the impurity implantation condition for forming a transistor or the like. Consequently, the degree of freedom in design can be extended.

A method of fabricating a semiconductor device according to a seventh aspect of the present invention comprises steps of forming a first silicon region and a second silicon region, forming a first silicide film on the first silicon region while forming a second silicide film on the second silicon region through a first salicide process, forming a mask layer to cover the first silicide film, and ion-implanting an impurity into the second silicide film through the mask layer thereby increasing the sheet resistance value of the second silicide film.

In the method of fabricating a semiconductor device according to the seventh embodiment, as hereinabove described, a first silicide film having a low sheet resistance value and a second silicide film having a high sheet resistance value can be easily formed through the steps of forming the mask layer to cover the first silicide film and ion-implanting the impurity into the second silicide film through the mask layer thereby increasing the sheet resistance value of the second silicide film. In this case, a second silicide film having an arbitrary high sheet resistance value can be formed by controlling the type of and the introduction condition for the impurity.

A method of fabricating a semiconductor device according to an eighth aspect of the present invention comprises steps of forming a first silicon region and a second silicon region consisting of the same silicon layer, forming conductive layers on the first silicon region and the second silicon region, forming a reaction inhibition film and an etching mask to cover the second silicon region and the conductive layer formed on the second silicon region, removing the conductive layer formed on the first silicon region by etching through the etching mask, and thereafter forming a first silicide film on the first silicon region through a salicide process.

In the method of fabricating a semiconductor device according to the eighth aspect, as hereinabove described, the reaction inhibition film and the etching mask are formed to cover the second silicon region and the conductive layer formed on the second silicon region for thereafter removing the conductive layer formed on the first silicon region by etching through the etching mask and thereafter forming the first silicide film on the first silicon region through the salicide process, whereby a silicide film or a conductive layer having a low sheet resistance value and a conductive layer or a silicide film having a high sheet resistance value can be easily obtained. In this case, the sheet resistance values of the first silicide film and the conductive layer can be easily controlled to prescribed values respectively by controlling the materials for and the thicknesses of the first silicide film and the conductive layer, for example. Thus, the sheet resistance value of a resistive element or the like can be easily set to an arbitrary value without controlling the impurity implantation condition for forming a transistor or the like. Consequently, the degree of freedom in design can be extended.

A method of fabricating a semiconductor device according to a ninth aspect of the present invention comprises steps of forming a silicon region, forming a silicide film on the silicon region, and deteriorating crystallinity of the silicide film thereby increasing the sheet resistance value of the silicide film.

In the method of fabricating a semiconductor device according to the ninth aspect, as hereinabove described, the sheet resistance value of the silicide film is increased by deteriorating crystallinity of the silicide film, whereby a silicide film having a high sheet resistance value can be easily obtained. Thus, a resistive element or the like requiring a high sheet resistance value can be easily formed by the silicide film.

In the aforementioned method of fabricating a semiconductor device according to the ninth aspect, the step of deteriorating crystallinity of the silicide film thereby increasing the sheet resistance value of the silicide film preferably includes a step of deteriorating crystallinity of the silicide film by ion-implanting an impurity into the silicide film. According to this structure, a silicide film having an arbitrary high sheet resistance value can be obtained by controlling the type of and the introduction condition for the impurity. Thus, the sheet resistance value of a resistive element or the like can be easily set to an arbitrary value. Consequently, the degree of freedom in design can be extended. In this case, the step of deteriorating crystallinity of the silicide film may include a step of ion-implanting an impurity into the silicide film thereby converting the silicide film to an amorphous state. Further, the impurity may include at least one element selected from a group consisting of Ge, Si, B, As, P and $BF_2$. In addition, the silicide film may contain Co.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

A method of fabricating a semiconductor device according to a first embodiment of the present invention is now described with reference to FIGS. 1 to 4.

Figure 1:
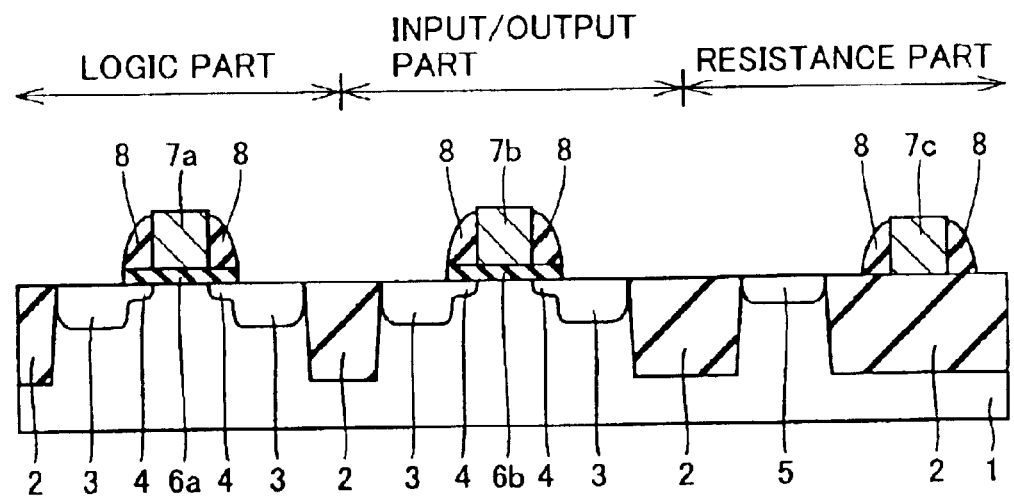
FIGS. 1 to 4 are sectional views for illustrating a process of fabricating a semiconductor device according to a first embodiment of the present invention.

As shown in FIG. 1, element isolation regions 2 consisting of SiO$_2$ films prepared by STI (shallow trench isolation) are formed on prescribed regions of the surface of a semiconductor substrate 1. A gate electrode 7a of polycrystalline silicon is formed on a region, corresponding to a logic part, of the surface of the semiconductor substrate 1 through a gate oxide film 6a. Another gate electrode 7b of polycrystalline silicon is formed on a region, corresponding to an input/output part, of the surface of the semiconductor substrate 1 through a gate oxide film 6b. Further, a resistance wire 7c of polycrystalline silicon is formed on the element forming region 2 in a resistance part. The gate electrodes 7a and 7b and the resistance wire 7c are formed by patterning the same polycrystalline silicon layer. An impurity is ion-implanted into the semiconductor substrate 1 through the gate electrodes 7a and 7b serving as masks, thereby forming low-concentration impurity diffusion layers 4.

Thereafter side wall insulator films 8 are formed on the side surfaces of the gate electrodes 7a and 7b and the resistance wire 7c. An impurity is ion-implanted into the semiconductor substrate 1 through the side wall insulator films 8 serving as masks, thereby forming high-concentration impurity diffusion layers 3. The high-concentration impurity diffusion layers 3 and the low-concentration impurity diffusion layers 4 form source/drain regions. An impurity is ion-implanted into the resistance part of the semiconductor substrate 1, thereby forming a resistance layer 5 consisting of an impurity diffusion layer.

The gate electrode 7a and the high-concentration impurity diffusion layers 4 of the logic part are examples of the "first silicon region" according to the present invention, while the gate electrode 7b and the high-concentration impurity diffusion layers 4 of the input/output part and the resistance layer 5 and the resistance wire 7c of the resistance part are examples of the "second silicon region" according to the present invention.

Figure 2:
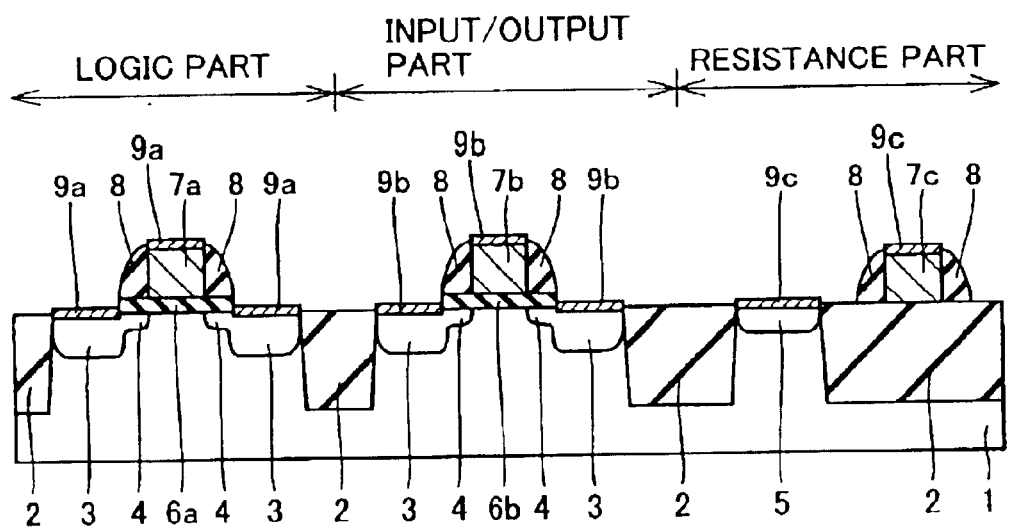

Then, a first salicide process is carried out as shown in FIG. 2. A Co film (not shown) having a thickness of about 4 nm is formed by sputtering, and thereafter a TiN film (not shown) for serving as a cap metal layer is formed on the Co film by sputtering with a thickness of about 10 nm. Thereafter RTA (rapid thermal annealing) is performed in a nitrogen atmosphere at a temperature of about 500° C. for about 10 seconds. Thus, silicification takes place between exposed Si regions and Co, for forming CoSi films 9a, 9b and 9c on the gate electrode 7a and the high-concentration impurity diffusion layers 3 of the logic part, the gate electrode 7b and the high-concentration impurity diffusion layers 3 of the input/output part and the resistance layer 5 as well as the resistance wire 7c respectively.

In this case, the CoSi films 9a, 9b and 9c are formed with relatively small thicknesses to have high sheet resistance values necessary for the input/output part and the resistance part. The CoSi films 9a are examples of the "first silicide film" according to the present invention, and the CoSi films 9b and 9c are examples of the "second silicide film" according to the present invention. Thereafter the TiN film (not shown) serving as the cap metal layer and unreacted parts of the Co film (not shown) are removed by etching in a mixed solution of sulfuric acid and hydrogen peroxide water of about 140° C.

Figure 3:
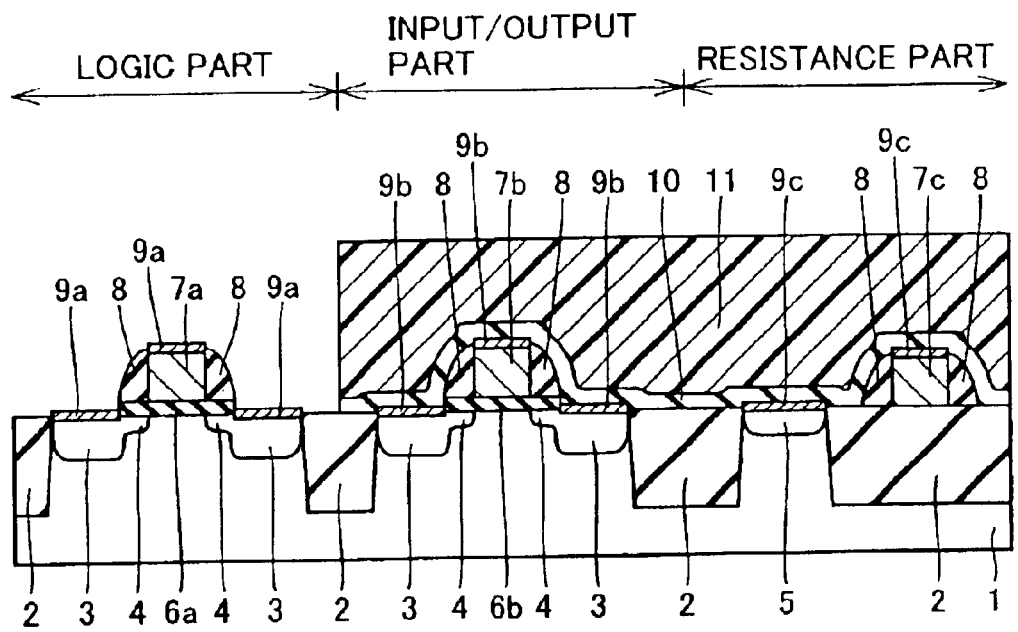

An SiN film (not shown) serving as a reaction inhibition film is formed on the overall surface of the semiconductor substrate 1 with a thickness of about 10 nm, and thereafter a resist film 11 is formed to cover the input/output part and the resistance part, as shown in FIG. 3. The resist film 11 is employed as an etching mask for performing etching with phosphoric acid at a temperature of about 160° C. for 7 minutes thereby removing the part of the SiN film formed on the logic part. Thus, a reaction inhibition film 10 of SiN is formed to cover the input/output part and the resistance part. Thereafter the resist film 11 is removed.

Figure 4:
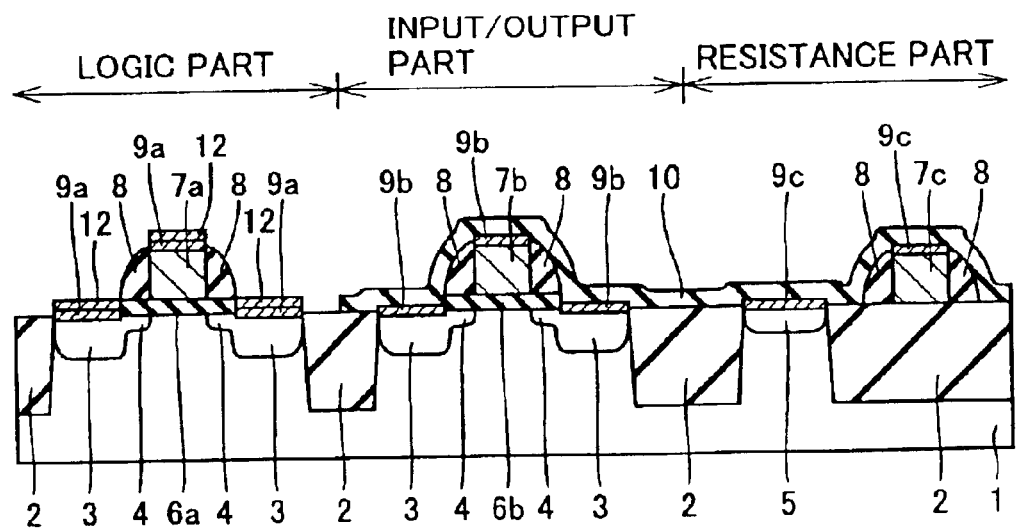

Then, a second salicide process is carried out as shown in FIG. 4. A Co film (not shown) is formed by sputtering with a thickness of about 7 nm, and a TiN film (not shown) having a thickness of about 10 nm is formed on the Co film by sputtering. RTA is performed in a nitrogen atmosphere at a temperature of about 500° C. for about 30 seconds. Thus, CoSi films 12 are formed on the CoSi films 9a of the logic part. The CoSi films 12 are examples of the "first silicide film" and the "third silicide film" according to the present invention. Thereafter the TiN film (not shown) serving as the cap metal layer and unreacted parts of the Co film (not shown) are removed by etching in a mixed solution of sulfuric acid and hydrogen peroxide water of about 140° C. Finally, RTA is performed at a temperature of about 850° C. for about 30 seconds for phase-changing the CoSi films 9a, 9b, 9c and 12 thereby forming multilayer films of phase-changed CoSi$_2$ films 9a and 12 having a low sheet resistance value of about 4 Ω/ on the logic part while forming phase-changed CoSi$_2$ films 9b and 9c having high sheet resistance values of about 20 Ω/ on the input/output part and the resistance part respectively. Thus, the semiconductor device according to the first embodiment is completed.

According to the first embodiment, as hereinabove described, the multilayer films of the CoSi films 9a and 12 having the thickness larger than those in the input/output part and the resistance part can be formed on the logic part by forming the CoSi films 9a, 9b and 9c on the logic part, the input/output part and the resistance part through the first salicide process, thereafter forming the reaction inhibition film 10 to cover the CoSi films 9b and 9c of the input/output part and the resistance part and further forming the CoSi films 12 on the CoSi films 9a of the logic part through the second salicide process. In this case, the sheet resistance values of the input/output part and the resistance part can be easily set to arbitrary values by controlling the thicknesses of the CoSi films 9a, 9b and 9c formed through the first salicide process. The resistance of the logic part can be reduced as compared with the input/output part and the resistance part by forming thick silicide films consisting of the multilayer films of the CoSi films 9a and 12 on the logic part.

According to the first embodiment, no impurity implantation condition for forming a transistor or the like may be controlled for controlling the sheet resistance values of the input/output part and the resistance part dissimilarly to the prior art but the sheet resistance values can be controlled by controlling only the thicknesses of the CoSi films 9b and 9c. Consequently, the degree of freedom in design can be extended.

The method according to the first embodiment includes no step of etching the CoSi films 9a dissimilarly to second to fourth embodiments described later, whereby no damage is caused by etching.

Second Embodiment

A method of fabricating a semiconductor device according to the second embodiment of the present invention is now described with reference to FIGS. 5 to 9.

Figure 5:
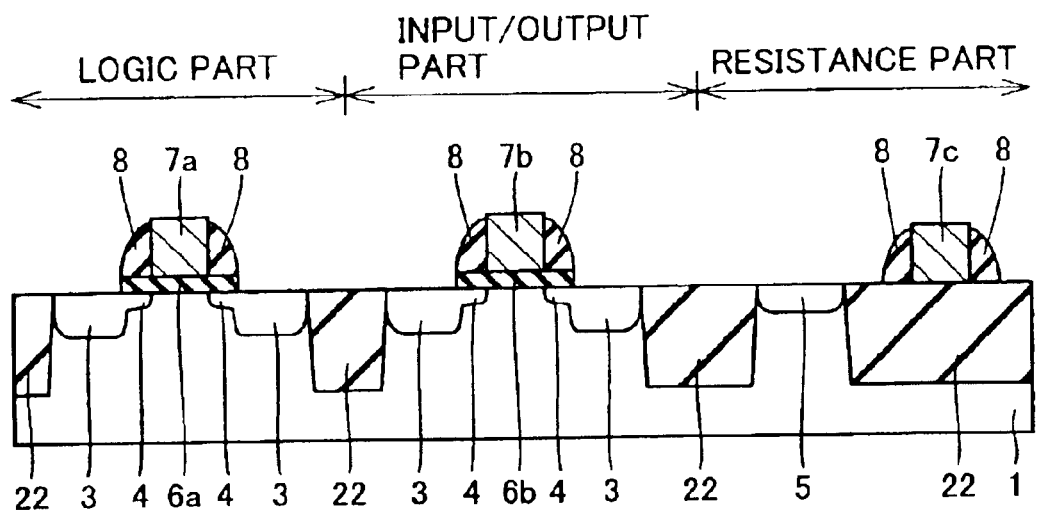
FIGS. 5 to 9 are sectional views for illustrating a process of fabricating a semiconductor device according to a second embodiment of the present invention.
Figure 6:
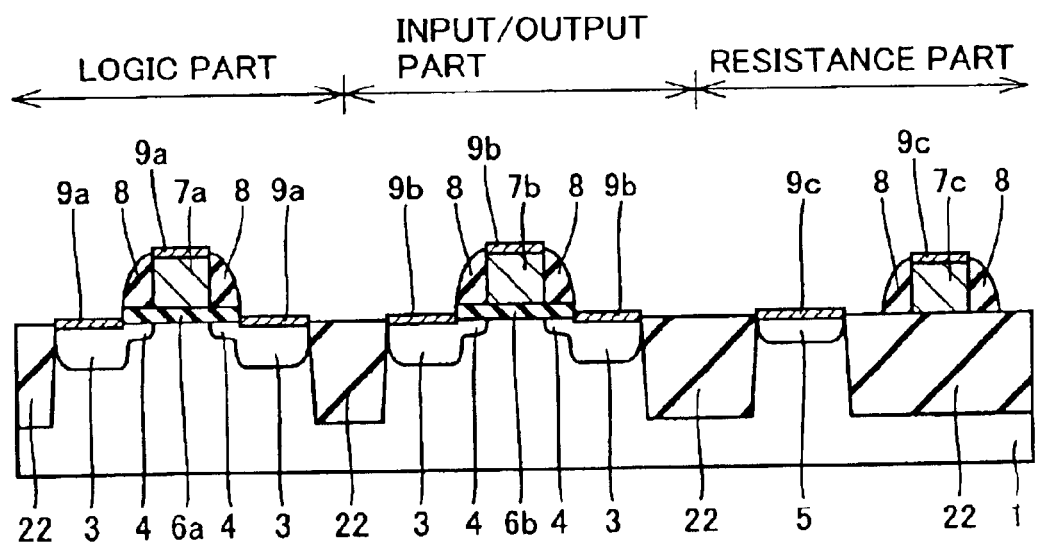
Figure 7:
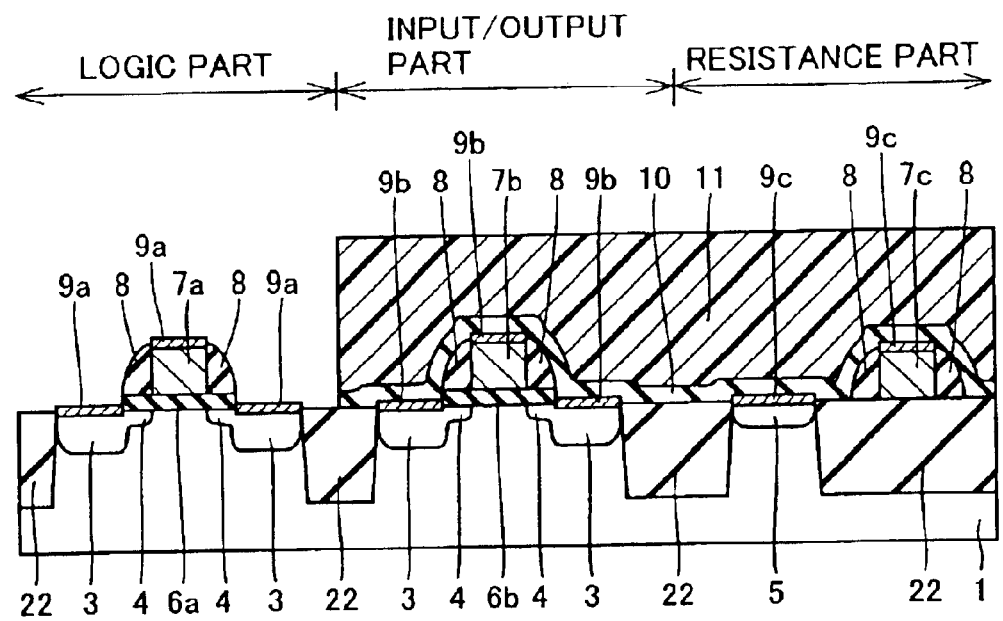

In the second embodiment, a process shown in FIGS. 5 to 7 is basically similar to the process of the aforementioned first embodiment shown in FIGS. 1 to 3. In the second embodiment, however, an acid solution is employed as an etching solution in a later step of etching CoSi films 9a, and hence acid-proof SiN films are employed as insulating materials forming element isolation regions 22 so that the element isolation regions 22 are not etched in the etching step.

Briefly, a configuration shown in FIG. 5 is formed for thereafter forming the CoSi films 9a on a logic part while forming CoSi films 9b and 9c on an input/output part and a resistance part respectively. The CoSi films 9a, 9b and 9c are formed with small thicknesses to attain high sheet resistance values necessary for the input/output part and the resistance part. Thereafter a reaction inhibition film 10 is formed through an etching mask of a resist film 11, as shown in FIG. 7.

Figure 8:
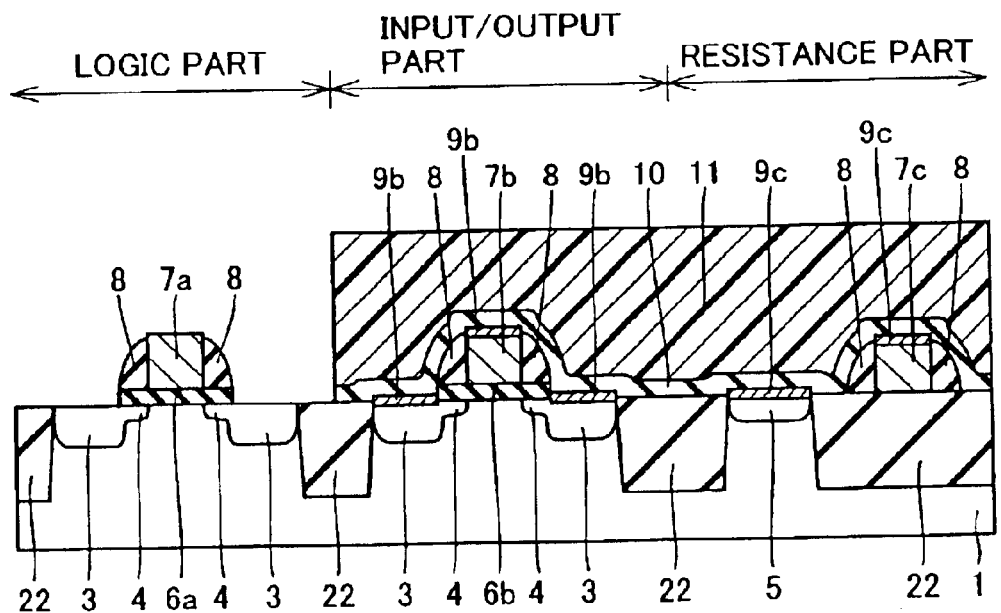

As shown in FIG. 8, the resist film 11 is employed as an etching mask for removing the CoSi films 9a formed on high-concentration impurity diffusion layers 3 and a gate electrode 7a of the logic part by etching with a 2% HF aqueous solution. In this case, the resist film 11 is an example of the "etching mask" according to the present invention. The resist film 11 is thereafter removed.

Figure 9:
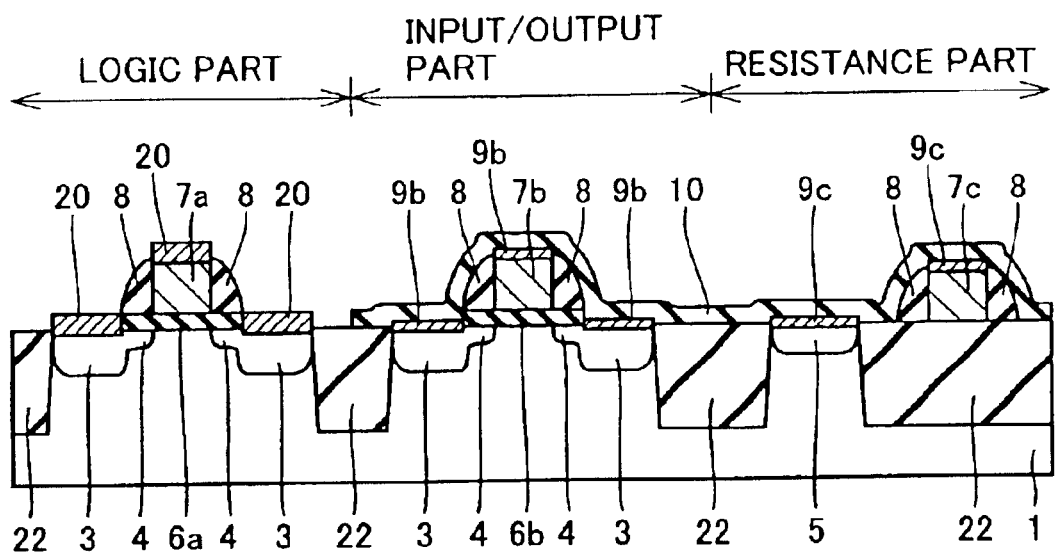

As shown in FIG. 9, a second salicide process is carried out. A Co film (not shown) is formed by sputtering with a thickness of about 10 nm, and a TiN film (not shown) serving as a cap metal layer is formed on the Co film by sputtering with a thickness of about 10 nm. Thereafter RTA is performed in a nitrogen atmosphere at a temperature of about 500° C. for about 30 seconds. Thus, CoSi films 20 larger in thickness than the CoSi films 9b and 9c of the input/output part and the resistance part are formed on the high-concentration diffusion layers 3 and the gate electrode 7a of the logic part. The CoSi films 20 are examples of the "first silicide film" and the "third silicide film" according to the present invention. Finally, RTA is performed at a temperature of about 850° C. for about 30 seconds for phase-changing the CoSi films 9b, 9c and 20. Thus, thick phase-changed $CoSi_2$ films 20 having a low sheet resistance value of about 4 Ω/ are formed on the logic part while thin phase-changed $CoSi_2$ films 9b and 9c having high sheet resistance values of about 20 Ω/ are formed on the input/output part and the resistance part respectively. Thus, the semiconductor device according to the second embodiment is completed.

According to the second embodiment, as hereinabove described, the CoSi films 9b and 9c having prescribed high sheet resistance values can be easily formed on the input/output part and the resistance part respectively while forming the CoSi films having the low sheet resistance value on the logic part by forming the CoSi films 9a, 9b and 9c on the logic part, the input/output part and the resistance part respectively through the first salicide process, thereafter removing the CoSi films 9a of the logic part by etching through the resist film 11 serving as a mask and thereafter forming the thick CoSi films 20 on the logic part through the second salicide process.

According to the second embodiment, further, no impurity implantation condition for forming a transistor or the like may be controlled for controlling the sheet resistance values of the input/output part and the resistance part dissimilarly to the prior art but the sheet resistance values can be easily controlled to arbitrary values by controlling only the thicknesses of the CoSi films 9b and 9c. Consequently, the degree of freedom in design can be extended.

According to the second embodiment, in addition, the CoSi films 20 are newly formed after removing the CoSi films 9a of the logic part as hereinabove described, whereby the characteristics of the films 20 can be uniformized as compared with the silicide films consisting of the multilayer films of the CoSi films 9a and 12 according to the first embodiment.

Third Embodiment

A method of fabricating a semiconductor device according to a third embodiment of the present invention is now described with reference to FIGS. 10 to 13.

Figure 10:
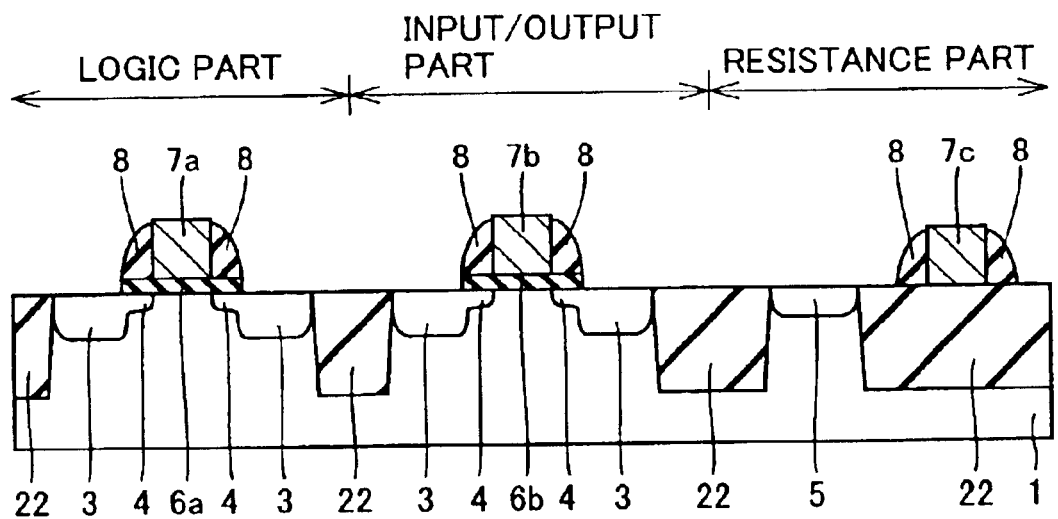
FIGS. 10 to 13 are sectional views for illustrating a process of fabricating a semiconductor device according to a third embodiment of the present invention.

First, a configuration shown in FIG. 10 is formed through a fabrication process similar to that of the first embodiment shown in FIG. 1. Also in the third embodiment, element isolation regions 22 are formed by acid-proof SiN films, similarly to the second embodiment.

Figure 11:
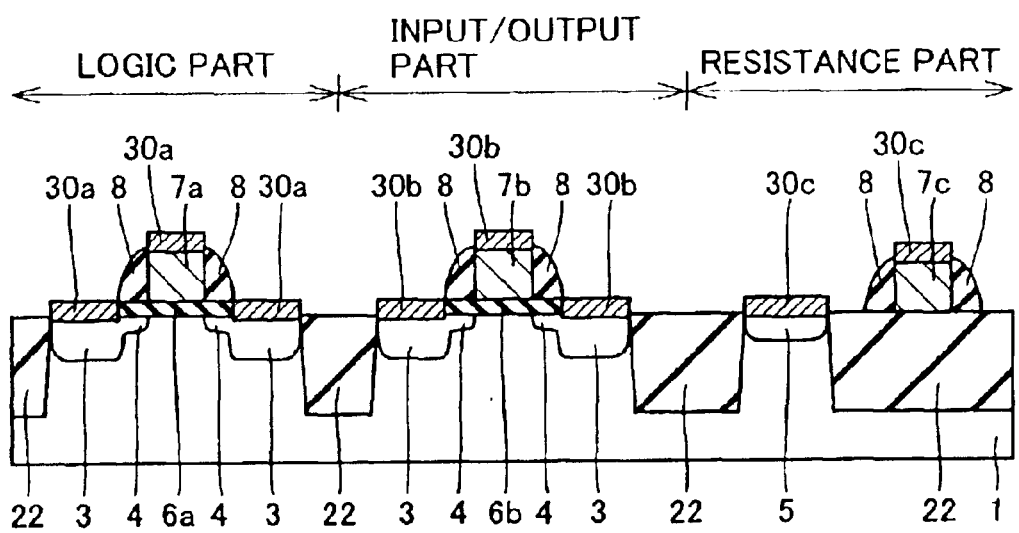

Then, a first salicide process is carried out as shown in FIG. 11. A Co film (not shown) is formed by sputtering with a thickness of about 10 nm, and a TiN film (not shown) serving as a cap metal layer is formed on the Co film by sputtering with a thickness of about 10 nm. Thereafter RTA is performed in a nitrogen atmosphere at a temperature of about 500° C. for about 10 seconds. Thus, silicification takes place between exposed Si regions and Co, thereby forming thick CoSi films 30a, 30b and 30c on a logic part, an input/output part and a resistance part respectively. The CoSi films 30a, 30b and 30c are formed with large thicknesses for attaining a low sheet resistance value necessary for the logic part. Thereafter the TiN film (not shown) serving as the cap metal layer and unreacted parts of the Co film (not shown) are removed by etching in a mixed solution of sulfuric acid and hydrogen peroxide water of about 140° C.

Figure 12:
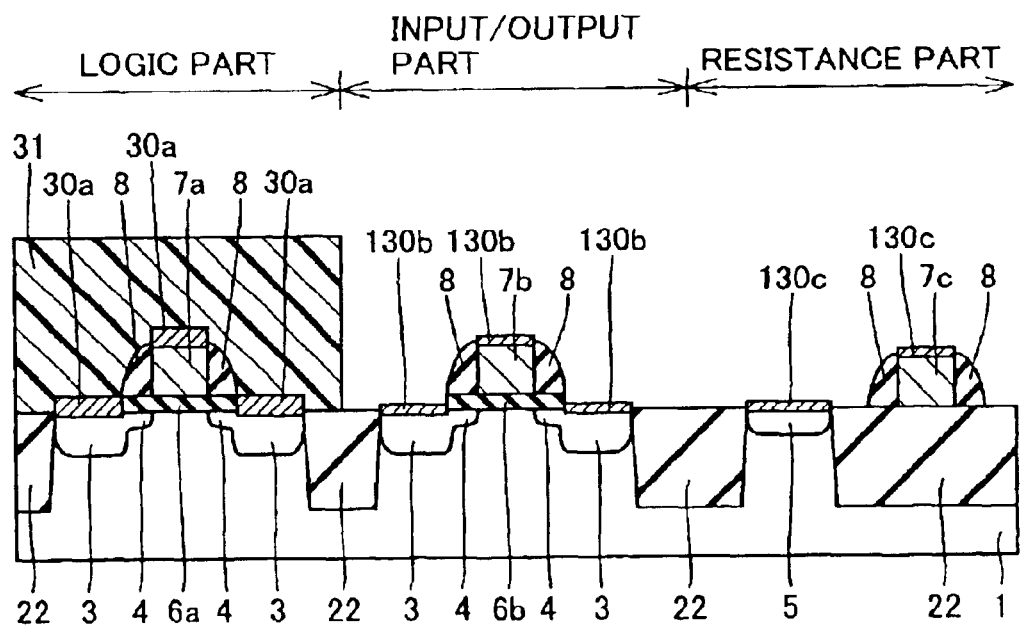
Figure 13:
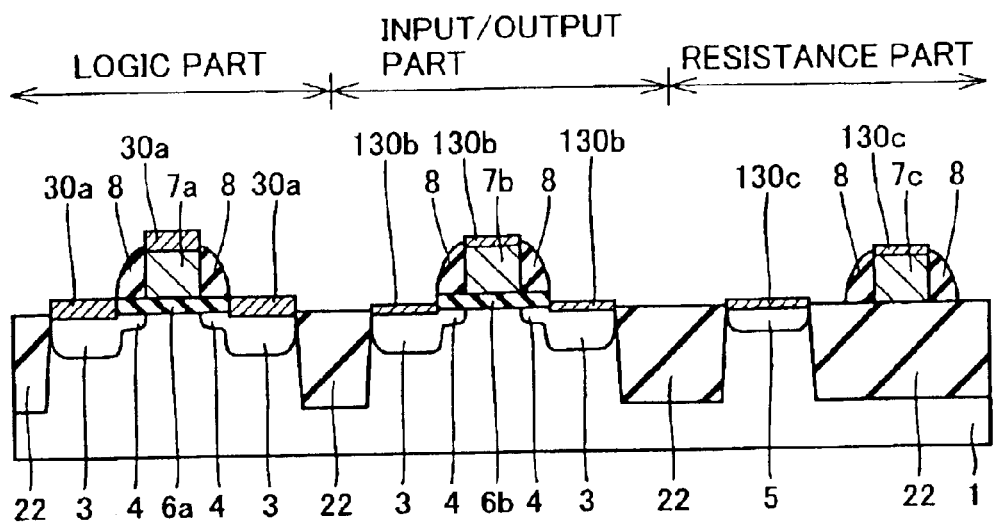

As shown in FIG. 12, a resist film 31 is formed to cover the logic part. The resist film 31 is an example of the "etching mask" according to the present invention. This resist film 31 is employed as a mask for etching the CoSi films 30b and 30c (see FIG. 11) of the input/output part and the resistance part by prescribed thicknesses with a 2% HF aqueous solution, thereby forming CoSi films 130b and 130c having smaller thicknesses than those in the logic part as shown in FIG. 12. The quantities of etching of the CoSi films 30b and 30c are so controlled that the etched CoSi films 130b and 130c have arbitrary high sheet resistance values necessary for the input/output part and the resistance part. The resist film 31 is removed thereby obtaining a configuration shown in FIG. 13.

Finally, RTA is performed at a temperature of about 850° C. for about 30 seconds for phase-changing the CoSi films 30a, 130b and 130c, thereby forming phase-changed $CoSi_2$ films 30a having a low sheet resistance value of about 4 Ω/ on the logic part while forming phase-changed $CoSi_2$ films 130b and 130c having high sheet resistance values of about 20 Ω/ on the input/output part and the resistance part respectively.

According to the third embodiment, silicide films (the CoSi films 30a) of low sheet resistance can be easily formed on the logic part while forming silicide films (the CoSi films 130b and 130c) of high sheet resistance on the input/output part and the resistance part respectively by forming the thick CoSi films 30a, 30b and 30c on the logic part, the input/output part and the resistance part through the first salicide process and thereafter etching the CoSi films 30b and 30c of the input/output part and the resistance part by prescribed thicknesses through the resist film 31, formed to cover the CoSi films 30a of the logic part, serving as an etching mask. In this case, the quantities of etching of the CoSi films 30b and 30c of the input/output part and the resistance part are so controlled that the sheet resistance values of the input/ output part and the resistance part can be easily controlled to arbitrary values without controlling an impurity implantation condition for forming a transistor or the like. Thus, the degree of freedom in design can be extended.

According to the third embodiment, further, no reaction inhibition film may be formed dissimilarly to the aforementioned first and second embodiments, whereby the fabrication process can be simplified.

Fourth Embodiment

Referring to FIGS. 14 to 19, a semiconductor device having three types of sheet resistance values is formed through a process basically similar to that of the aforementioned third embodiment according to a fourth embodiment of the present invention. The fourth embodiment is now described in detail.

Figure 14:
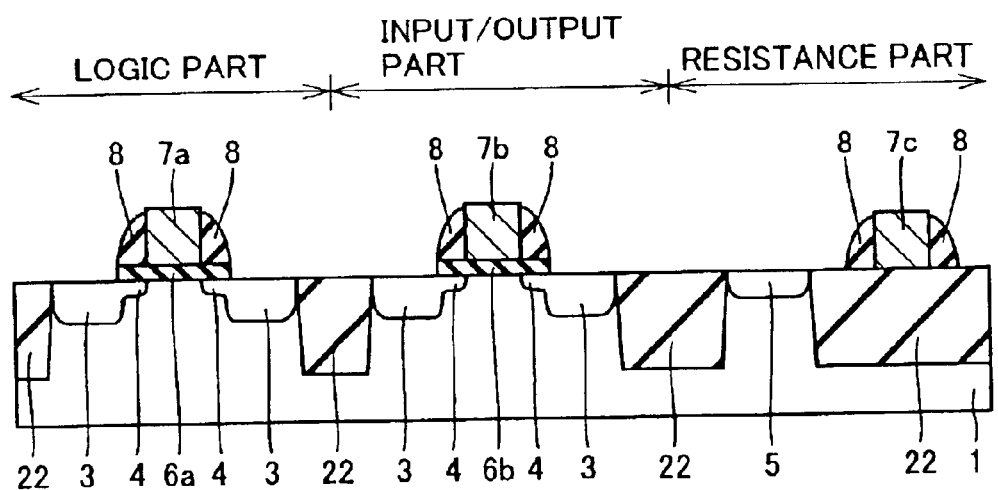
FIGS. 14 to 19 are sectional views for illustrating a process of fabricating a semiconductor device according to a fourth embodiment of the present invention.
Figure 15:
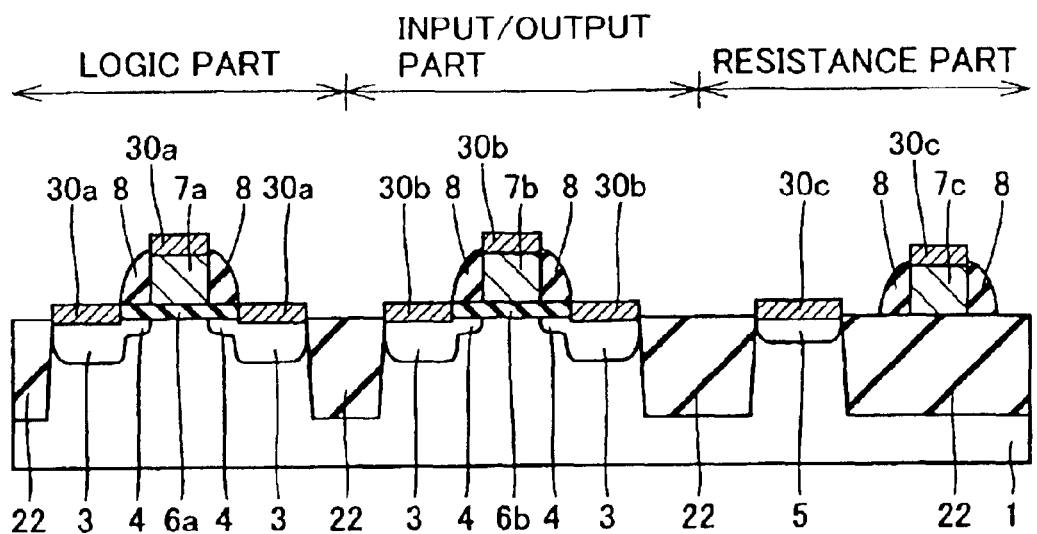
Figure 16:
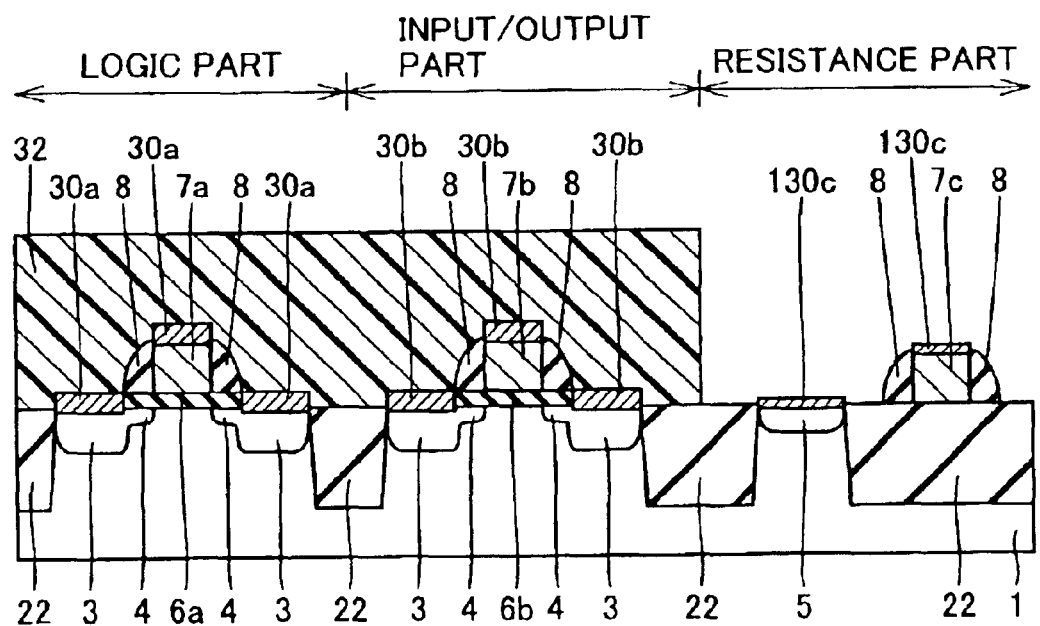
Figure 17:
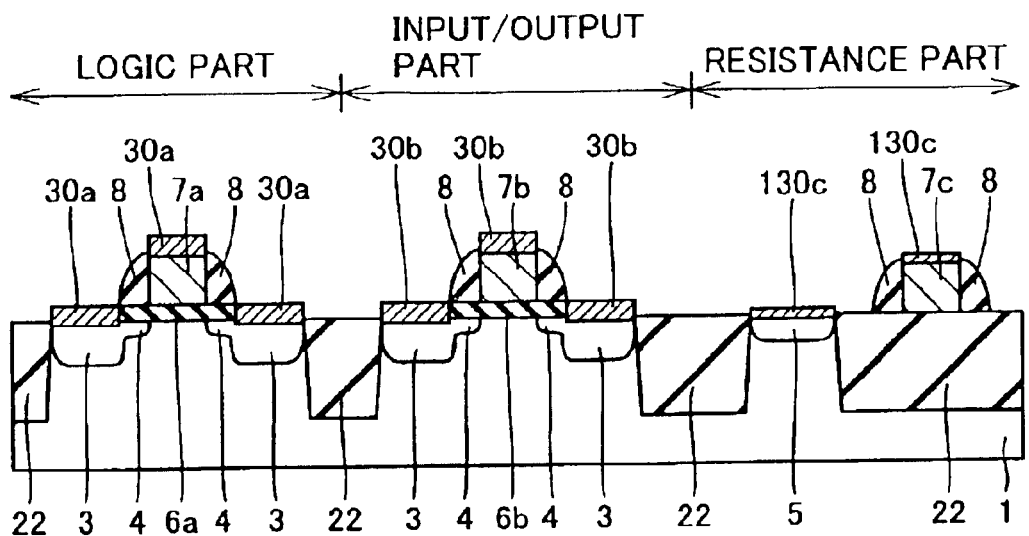

Steps shown in FIGS. 14 and 15 are similar to those of the third embodiment shown in FIGS. 10 and 11. A configuration shown in FIG. 14 is formed for thereafter forming thick CoSi films 30a, 30b and 30c on a logic part, an input/output part and a resistance part respectively through a first salicide process as shown in FIG. 15, and a resist film 32 for serving as an etching mask is formed to cover the logic part and the input/output part as shown in FIG. 16. The resist film 32 is employed as a mask for etching the CoSi films 30c (see FIG. 15) formed on a resistance layer 5 and a resistance wire 7c by prescribed thicknesses with a 2% HF aqueous solution for about 30 seconds. Thus, thin CoSi films 130c are formed on the resistance layer 5 and the resistance wire 7c, as shown in FIG. 16. The thin CoSi films 130c are formed to have a high sheet resistance value necessary for the resistance part. Thereafter the resist film 32 is removed thereby obtaining a configuration shown in FIG. 17.

Figure 18:
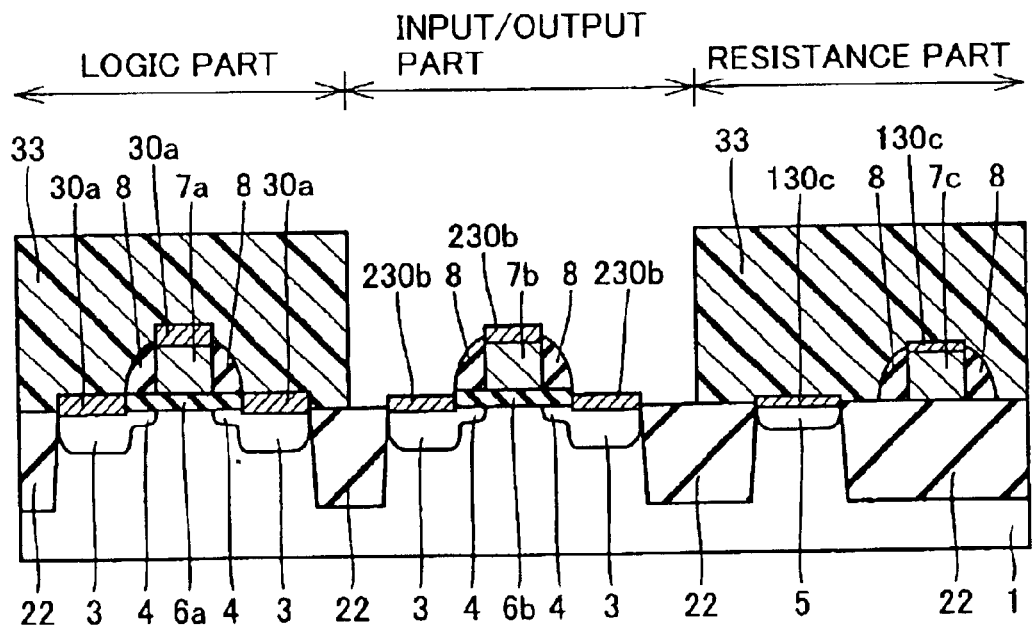

Then, a resist film 33 is formed to cover the logic part and the resistance part, as shown in FIG. 18. The resist film 33 is an example of the "etching mask" according to the present invention. This resist film 33 is employed as a mask for etching the CoSi films 30b (see FIG. 17) of the input/output part with a 2% HF aqueous solution for about 20 seconds, thereby forming CoSi films 230b smaller in thickness than the CoSi films 30a of the logic part and larger in thickness than the CoSi films 130c of the resistance part. Thereafter the resist film 33 is removed.

Figure 19:
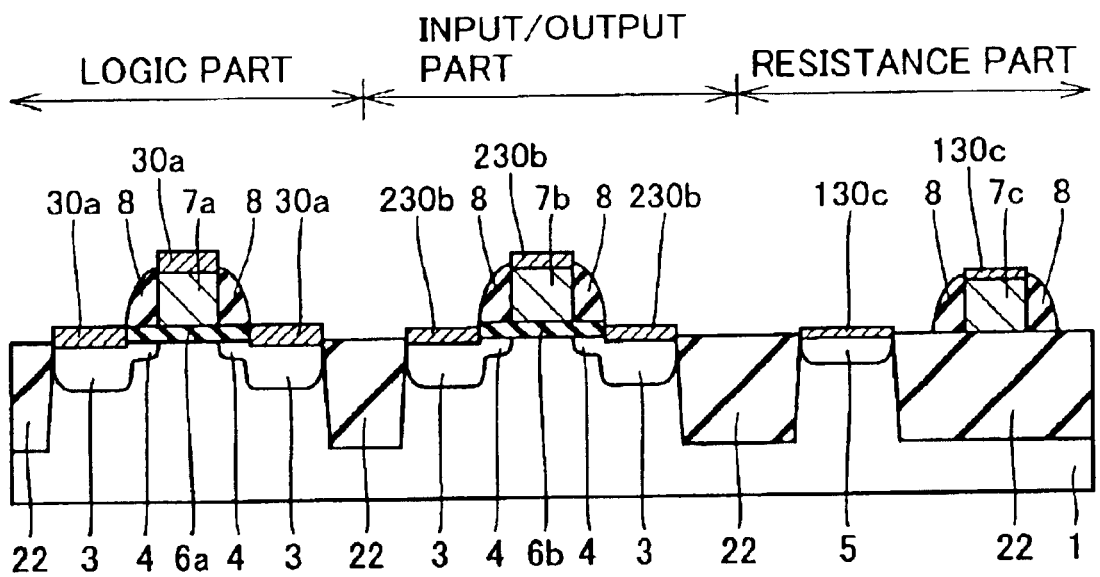

Thus, a configuration shown in FIG. 19 is obtained. Finally, RTA is performed at a temperature of about 850° C. for about 30 seconds for phase-changing the CoSi films 30a, 230b and 130c, thereby forming phase-changed $CoSi_2$ films 30a having a low sheet resistance value of about 4 Ω/ on the logic part while forming phase-changed $CoSi_2$ films 230b having an intermediate sheet resistance value of about 15 Ω/ on the input/output part and forming phase-changed $CoSi_2$ films 130c having a high sheet resistance value of about 20 Ω/ on the resistance part respectively.

According to the fourth embodiment, silicide films (the phase-changed $CoSi_2$ films 30a, 230b an 130c) having three types of sheet resistance values can be easily formed by controlling only the quantities (times) for etching silicide films through the aforementioned process without controlling an impurity implantation condition for forming a transistor or the like. Thus, the degree of freedom in design can be extended.

Fifth Embodiment

A method of fabricating a semiconductor device according to a fifth embodiment of the present invention is now described with reference to FIGS. 20 to 27.

Figure 20:
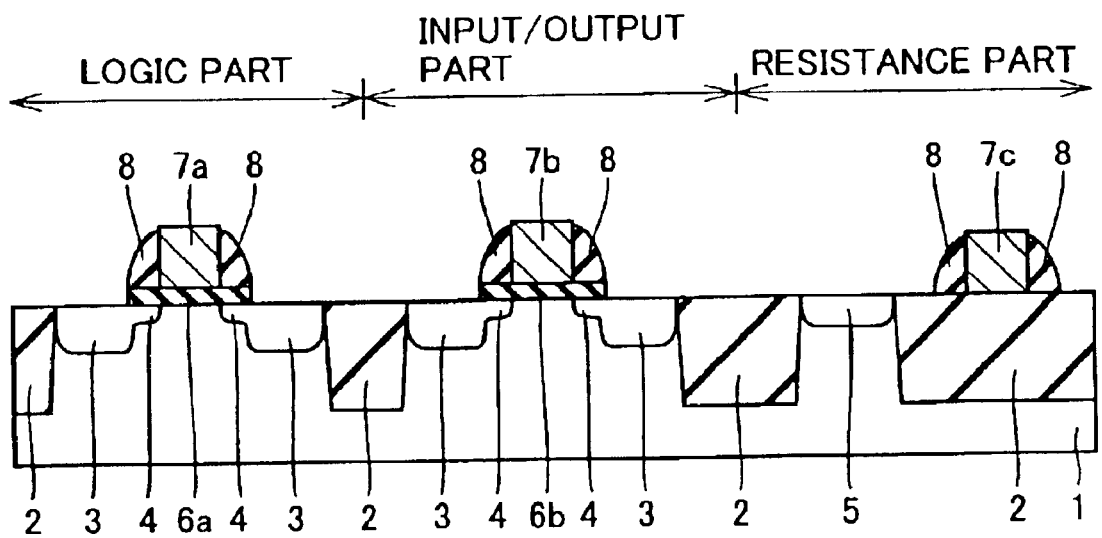
FIGS. 20 to 24 are sectional views for illustrating a process of fabricating a semiconductor device according to a fifth embodiment of the present invention.
Figure 21:
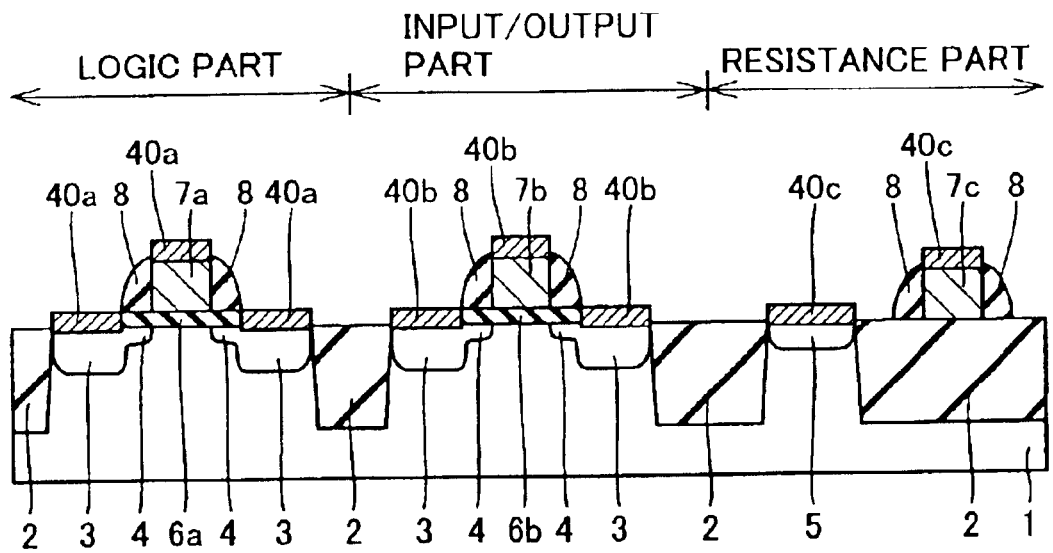

First, a configuration shown in FIG. 20 is formed through a process similar to that of the first embodiment shown in FIG. 1. Thereafter a first salicide process is carried out as shown in FIG. 21. A Co film (not shown) is formed by sputtering with a thickness of about 10 nm, and a TiN film (not shown) serving as a cap metal layer is formed on the Co film by sputtering with a thickness of about 10 nm. RTA is performed in a nitrogen atmosphere at a temperature of about 500° or about 10 seconds. Thus, silicification takes place between exposed Si regions and Co, thereby forming thick CoSi films 40a, 40b and 40c on a logic part, an input/output part and a resistance part respectively. The CoSi films 40a, 40b and 40c are formed to attain a low sheet resistance value necessary for the logic part.

Thereafter the TiN film (not shown) serving as the cap metal layer and unreacted parts of the Co film (not shown) are removed by etching in a mixed solution of sulfuric acid and hydrogen peroxide water of about 140° C. RTA is performed at a temperature of about 850° C. for about 30 seconds for phase-changing the CoSi films 40a, 40b and 40c, thereby forming phase-changed $CoSi_2$ films 40a, 40b and 40c.

Figure 22:
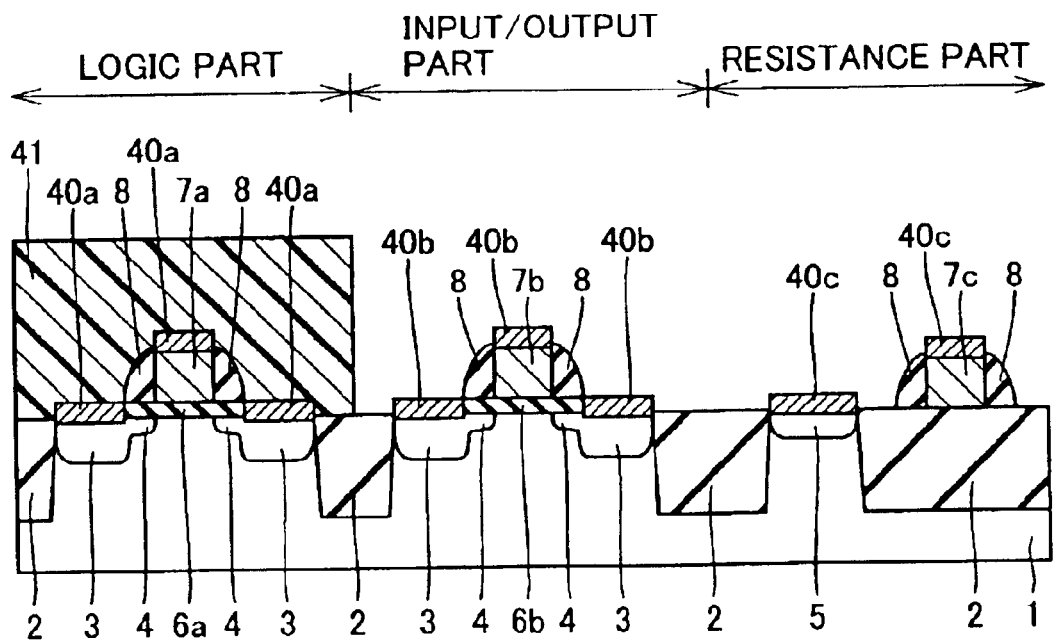
Figure 23:
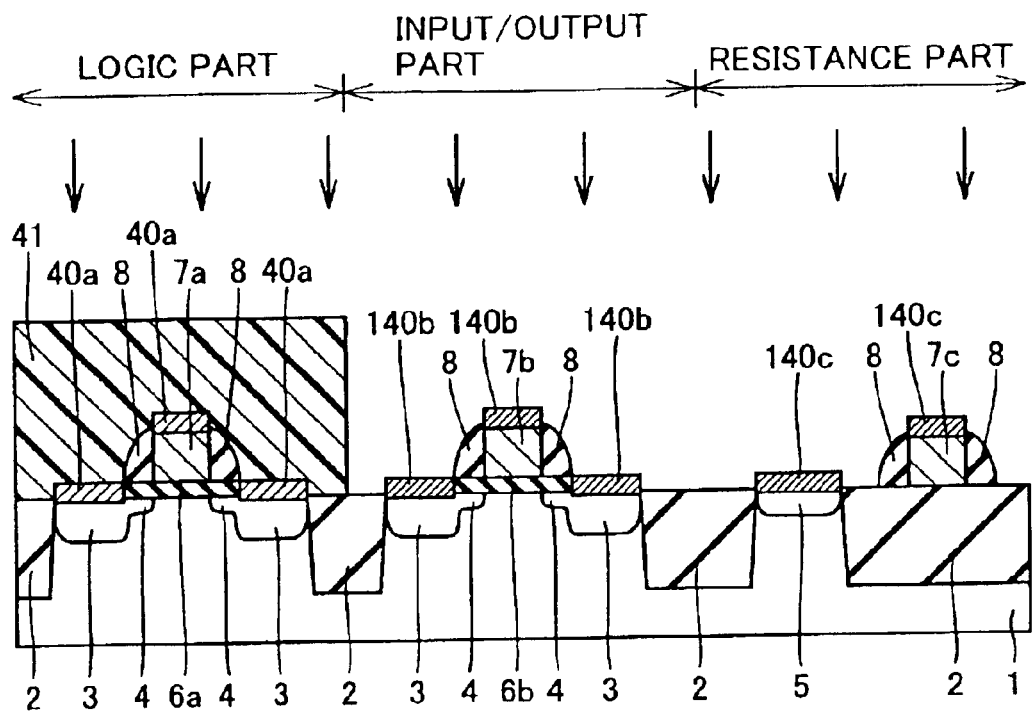

As shown in FIG. 22, a resist film 41 is formed to cover the logic part. The resist film 41 is an example of the "mask layer" according to the present invention. This resist film 41 is employed as an implantation mask for implanting boron ions ($B^+$) into the $CoSi_2$ films 40b and 40c of the input/output part and the resistance part under conditions of 10 keV and $2 \times 10^{15}$ cm$^{-2}$, thereby forming $CoSi_2$ films 140b and 140c containing the implanted boron ions as shown in FIG. 23. Thereafter the resist film 41 is removed thereby obtaining a configuration shown in FIG. 24.

Figure 25:
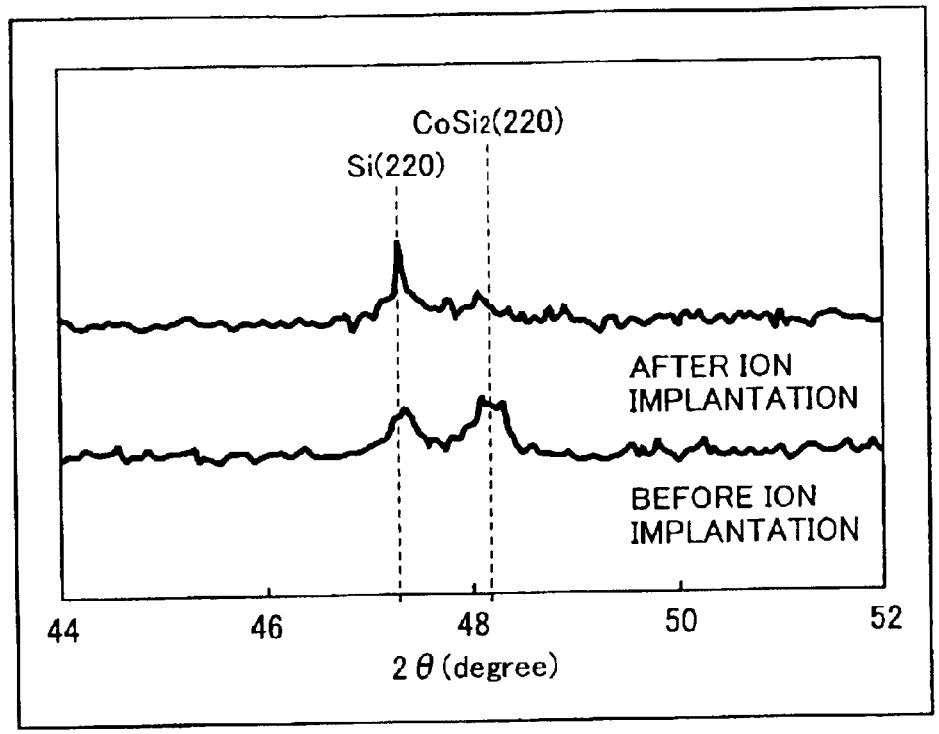
FIG. 25 is a characteristic diagram showing results of crystallinity of silicide films evaluated by XRD before and after impurity ion implantation in the fifth embodiment.

FIG. 25 shows results of crystallinity of the $CoSi_2$ films 140b and 140c evaluated by XRD before and after the ion implantation. As shown in FIG. 25, a (220) peak of $CoSi_2$ disappears due to the ion implantation while only a peak of Si (220) forming lower Si layers remains. Thus, it is understood that the $CoSi_2$ films 140b and 140c are deteriorated in crystallinity and converted to amorphous states due to the ion implantation.

Figure 26:
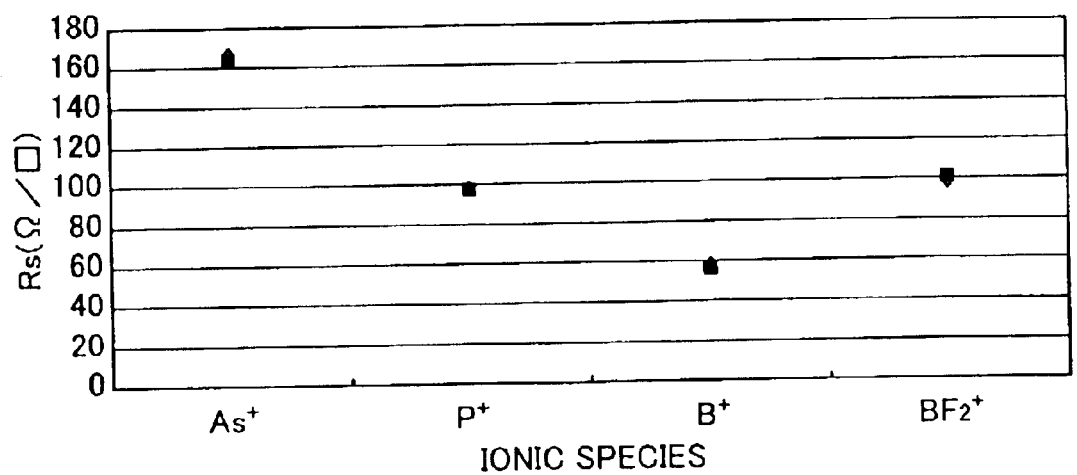
FIG. 26 is a characteristic diagram for illustrating increase of the sheet resistance values of the silicide films resulting from impurity ion implantation in the fifth embodiment of the present invention.
Figures 27, 28:
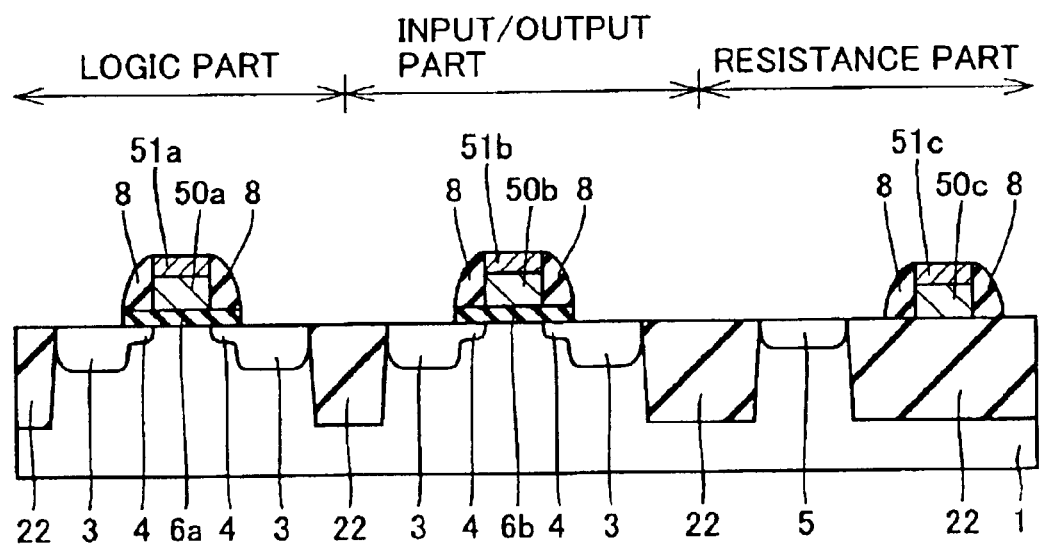
FIG. 27 is a diagram for illustrating experimental conditions for obtaining the characteristic diagram shown in FIG. 26.
FIGS. 28 to 32 are sectional views for illustrating a process of fabricating a semiconductor device according to a sixth embodiment of the present invention.

As shown in FIG. 26, further, the sheet resistance value of each of the $CoSi_2$ films 140b and 140c containing the implanted boron ions reaches about 60 Ω/. FIG. 26 is a characteristic diagram showing sheet resistance values $R_S$ after ion implantation on the assumption that the resistance value of a $CoSi_2$ film formed on a silicon substrate before ion implantation is 4.1 Ω/. FIG. 27 shows the types of ions employed in this experiment and corresponding acceleration energy values and doses (implantation conditions). Under the experimental conditions shown in FIG. 27, Rp is set to 30 nm so that the implantation peak is on a position of 30 nm in depth from the surface of the Si substrate.

It is clearly understood from FIG. 26 that the sheet resistance value is increased from 4.1 Ω/ to about 60 Ω/ when boron ions are implanted into the $CoSi_2$ film. It is also understood that the sheet resistance value of the $CoSi_2$ film can be also increased by implanting phosphorus ions ($P^+$), arsenic ions ($As^+$) or $BF_{2+}$ into the $CoSi_2$ film in place of the boron ions.

The sheet resistance value of the $CoSi_2$ film is thus increased by ion implantation conceivably for the following reason: In ion implantation, the $CoSi_2$ film is impacted to be deteriorated in crystallinity and converted to an amorphous state, conceivably leading to remarkable deterioration of electric conductivity on crystal grain boundaries. Consequently, current hardly flows to conceivably increase the resistance value. In this case, the $CoSi_2$ film is remarkably impacted by ions having large mass and extremely deteriorated in crystallinity, leading to remarkable reduction of electric conduction. In other words, resistive fluctuation can be increased in order of $As^+$ (75)>$BF_2^+$ (49)>$P^+$ (31)>$B^+$ (11) (parenthesized numerals indicate the mass values of the ionic species).

Figure 24:
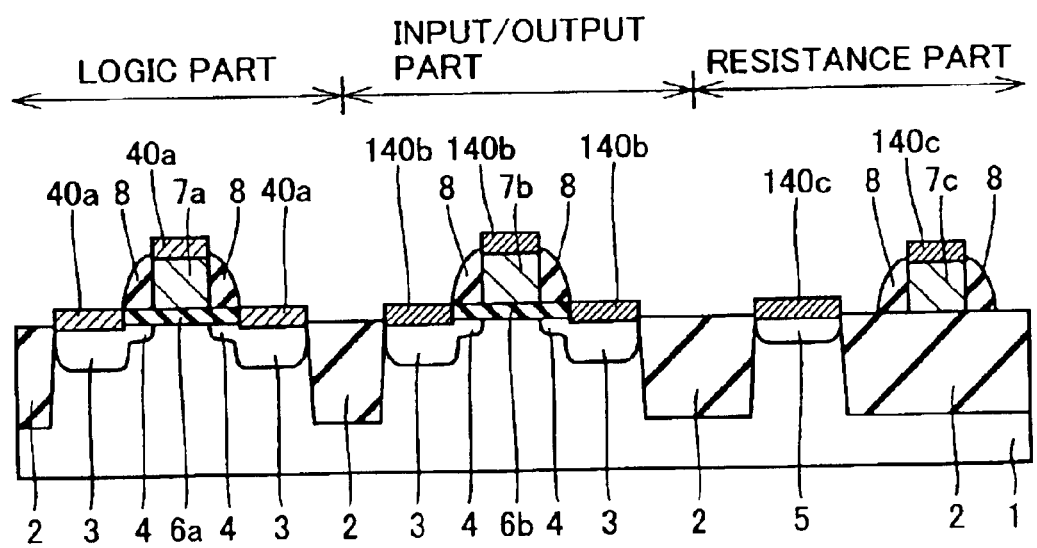

As shown in FIG. 24, the $CoSi_2$ films 40a having the low resistance value of about 4 Ω/ can be formed on the logic part and the $CoSi_2$ films 140b and 140c having the high resistance value of about 60 Ω/ due to implantation of boron ions can be formed on the input/output part and the resistance part respectively in the aforementioned manner.

According to the fifth embodiment, as hereinabove described, the sheet resistance values of the input/output part and the resistance part can be increased by forming the thick phase-changed $CoSi_2$ films 40a, 40b and 40c on the logic part, the input/output part and the resistance part respectively through the salicide process and thereafter implanting boron ions into the $CoSi_2$ films 40b and 40c of the input/output part and the resistance part through the resist film 41, formed to cover the logic part, serving as an implantation mask. In this case, the sheet resistance values of the $CoSi_2$ films 140b and 140c of the input/output part and the resistance part can be set to arbitrary values by controlling implantation conditions for the impurity (boron ions).

The method according to the fifth embodiment employs no reaction inhibition film, whereby the fabrication process can be simplified. Further, no $CoSi_2$ films are etched so that no damage is caused by etching.

Sixth Embodiment

Referring to FIGS. 28 to 32, silicide films are formed not on an input/output part and a resistance part but only on a logic part through a salicide process according to a sixth embodiment of the present invention, dissimilarly to the aforementioned first to fifth embodiments. The sixth embodiment is now described in detail.

First, element isolation regions 22 employing SiN films prepared by STI as insulating materials are formed on prescribed regions of the surface of a semiconductor substrate 1, as shown in FIG. 28. A gate electrode of a polycide structure consisting of a polycrystalline silicon layer 50a and a tungsten silicide layer (WSi layer) 51a is formed on the logic part provided on the surface of the semiconductor substrate 1 through a gate oxide film 6a. Similarly, a gate electrode of a polycide structure consisting of a polycrystalline silicon layer 50b and a WSi layer 51b is also formed on the input/output part through a gate oxide film 6b. A resistance wire of a polycide structure consisting of a polycrystalline silicon layer 50c and a WSi layer 51c is formed on the element isolation region 22 of the resistance part.

The polycrystalline silicon layer 50a is an example of the "first silicon region" according to the present invention, and the polycrystalline silicon layers 50b and 50c are examples of the "second silicon region" according to the present invention. The WSi layers 51a, 51b and 51c are examples of the "conductive layer" and the "silicide film" according to the present invention.

The gate electrodes of the logic part and the input/output part are employed as masks for ion-implanting an impurity into the semiconductor substrate 1, thereby forming low-concentration impurity diffusion layers 4. Side wall insulator films 8 are formed on the side surfaces of the gate electrodes and the resistance wire provided on the element isolation region 22. The side wall insulator films 8 of the logic part and the input/output part are employed as masks for ion-implanting an impurity into the semiconductor substrate 1, thereby forming high-concentration impurity diffusion layers 3. The high-concentration impurity diffusion layers 3 and the low-concentration impurity diffusion layers 4 form source/drain regions. An impurity is ion-implanted into the surface part of the semiconductor substrate 1 forming the resistance part, thereby forming a resistance layer 5.

Figure 29:
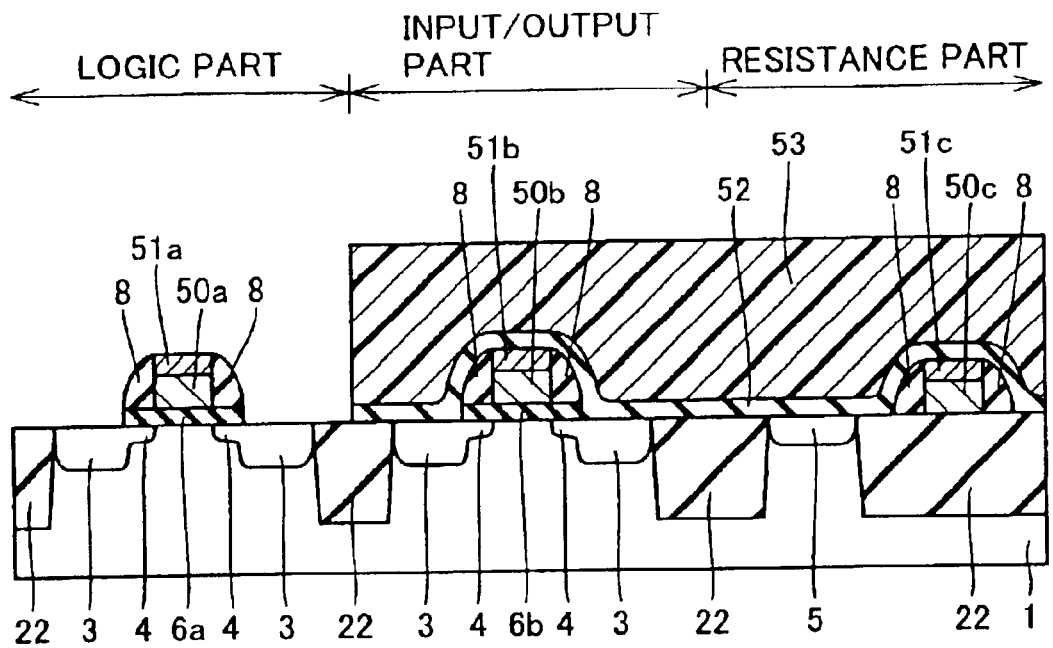
Figure 30:
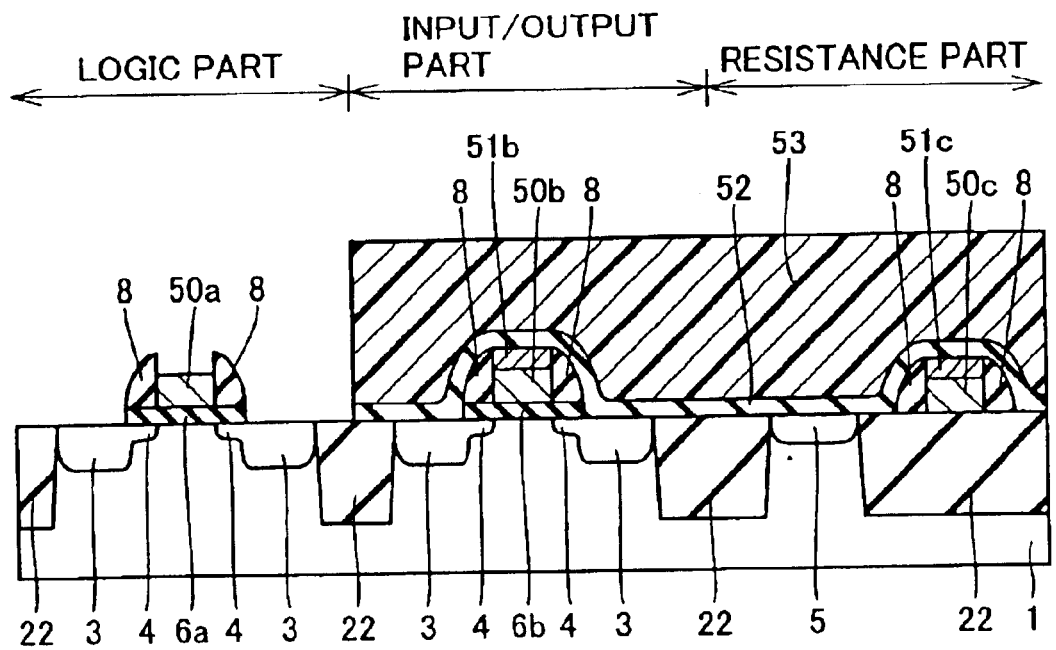

Thereafter an SiN film (not shown) serving as a reaction inhibition film is formed with a thickness of about 10 nm to cover the overall surface, and a resist film 53 is formed to cover the input/output part and the resistance part as shown in FIG. 29. The resist film 53 is employed as a mask for etching the SiN film, thereby forming a reaction inhibition film 52 consisting of the patterned SiN film. The resist film 53 is an example of the "etching mask" according to the present invention. Thereafter the WSi layer 51a of the logic part is removed by etching through the resist film 53 serving as a mask, thereby obtaining a configuration shown in FIG. 30. Thereafter the resist film 53 is removed.

Figure 31:
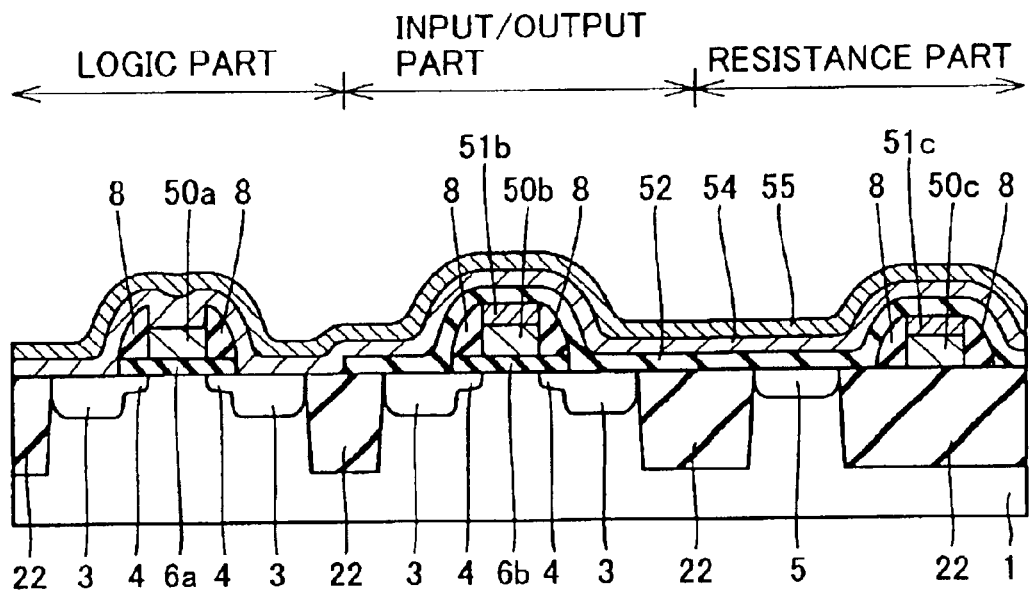
Figure 32:
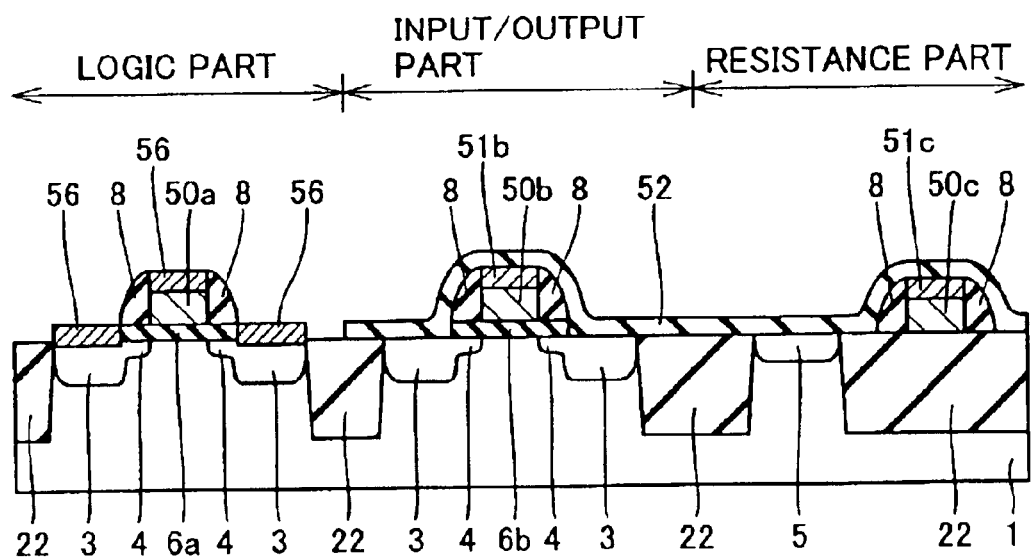

As shown in FIG. 31, a Co film 54 is formed by sputtering with a thickness of about 10 nm to cover the overall surface, and a TiN film 55 serving as a cap metal layer is formed on the Co film 54 by sputtering with a thickness of about 10 nm. RTA is performed in a nitrogen atmosphere at a temperature of about 500° C. for about 30 seconds, thereby forming thick CoSi films 56 on the logic part as shown in FIG. 32. Thereafter the TiN film 55 serving as the cap metal layer and unreacted parts of the Co film 54 are removed by etching in a mixed solution of sulfuric acid and hydrogen peroxide water of about 140° C., thereby obtaining the configuration shown in FIG. 32. Finally, RTA is performed at a temperature of about 850° C. for about 30 seconds for phase-changing the CoSi films 56. Thus, phase-changed $CoSi_2$ films 56 having a low sheet resistance of about 4 Ω/ are formed on the logic part. A gate electrode and a resistance wire of high-resistance polycide structures, having sheet resistance values of about 50 Ω/, consisting a polycrystalline silicon layer 50b as well as a $WSi_2$ layer 51b and a polycrystalline silicon layer 50c as well as a $WSi_2$ layer 51c are formed on the input/output part and the resistance part respectively.

According to the sixth embodiment, as hereinabove described, the sheet resistance values of the input/output part and the resistance part can be easily set to arbitrary values without controlling an impurity condition for forming a transistor or the like while obtaining a low resistance value on the logic part by previously forming the gate electrodes and the resistance wire having high resistance values necessary for the input/output part and the resistance part on the logic part, the input/output part and the resistance part, thereafter removing the WSi layer 51a of the logic part and forming the phase-changed $CoSi_2$ films 56 of low resistance on the logic part through the salicide process. Thus, the degree of freedom in design can be extended.

Seventh Embodiment

Figure 33:
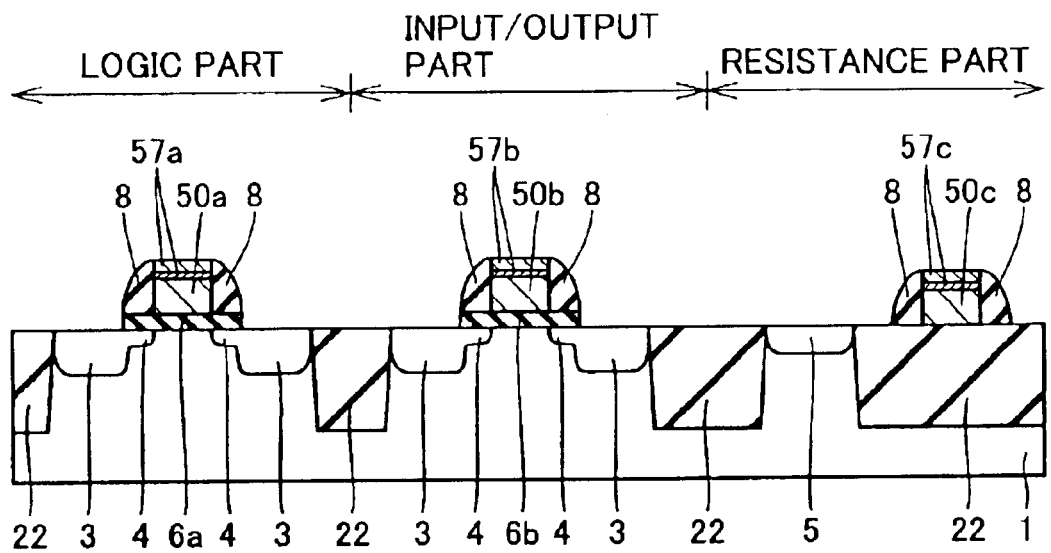
FIGS. 33 to 37 are sectional views for illustrating a process of fabricating a semiconductor device according to a seventh embodiment of the present invention.

Referring to FIGS. 33 to 37, a process similar to that of the aforementioned sixth embodiment is basically employed in a seventh embodiment of the present invention. According to the seventh embodiment, however, not polycide structures but multilayer structures consisting of polycrystalline silicon layers and metal layers are employed for gate electrodes and a resistance wire previously formed on a logic part, an input/output part and a resistance part respectively, as shown in FIG. 33.

More specifically, the gate electrode of the logic part is formed by a multilayer structure of a polycrystalline layer 50a and a Ti/TiN layer 57a having a Ti (upper layer)/TiN (lower layer) structure. The gate electrode of the input/output part is formed by a multilayer structure of a polycrystalline silicon layer 50b and a Ti/TiN layer 57b having a Ti (upper layer)/TiN (lower layer) structure. Further, the resistance wire provided on an element isolation region 22 of the resistance part is formed by a multilayer structure of a polycrystalline silicon layer 50c and a Ti/TiN layer 57c having a Ti (upper layer)/TiN (lower layer) structure. The Ti/TiN layers 57a, 57b and 57c are examples of the "conductive layer" and the "metal layer" according to the present invention.

Figure 34:
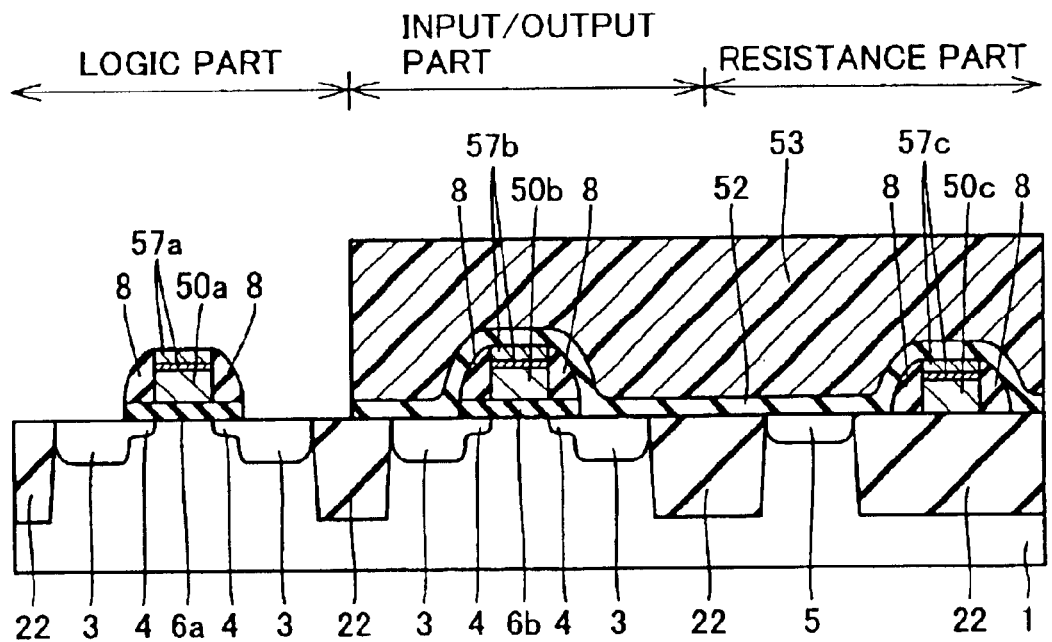
Figure 35:
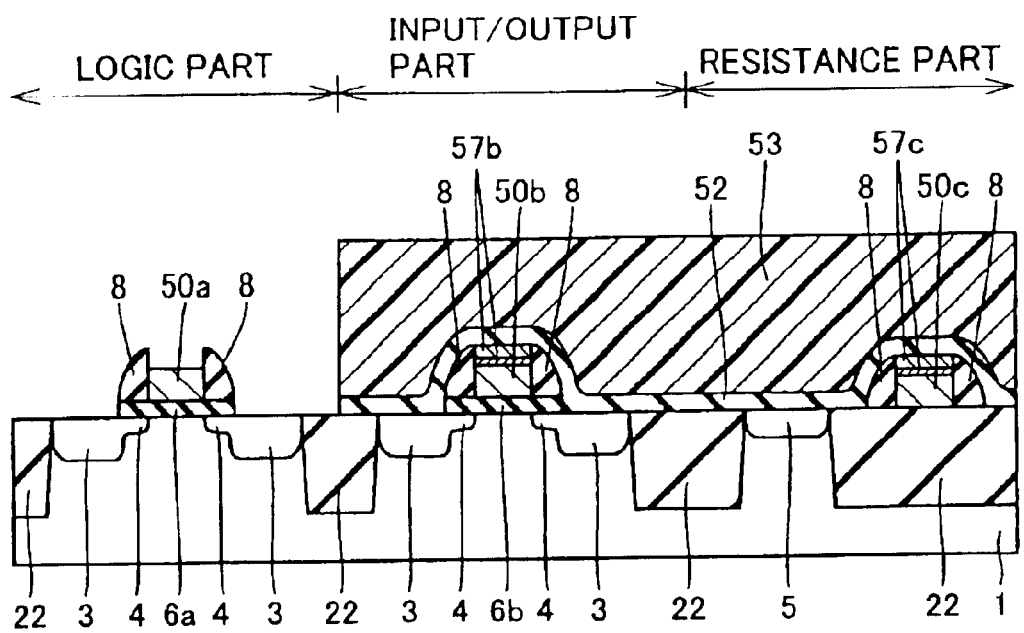

Thereafter an SiN film (not shown) serving as a reaction inhibition film is formed with a thickness of about 10 nm to cover the overall surface, and a resist film 53 is formed to cover the input/output part and the resistance part, as shown in FIG. 34. The resist film 53 is employed as a mask for etching the SiN film with phosphoric acid (160° C.) for 7 minutes, thereby forming a reaction inhibition film 52 covering the input/output part and the resistance part. Further, the Ti/TiN layer 57a forming the upper layer of the gate electrode of the logic part is removed by etching through the resist film 53 serving as a mask, thereby obtaining a configuration shown in FIG. 35. Thereafter the resist film 53 is removed.

Figure 36:
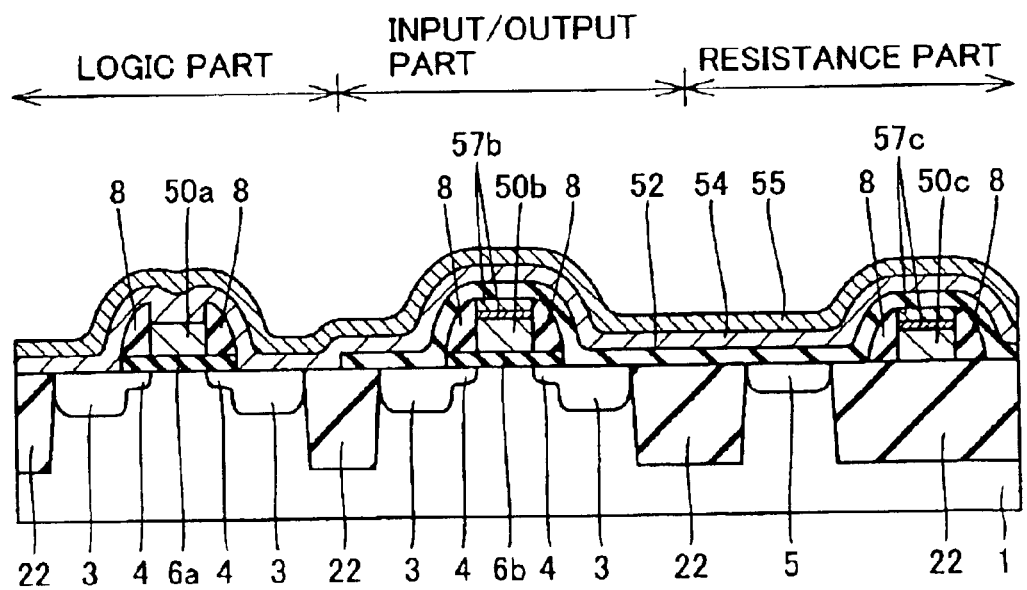
Figure 37:
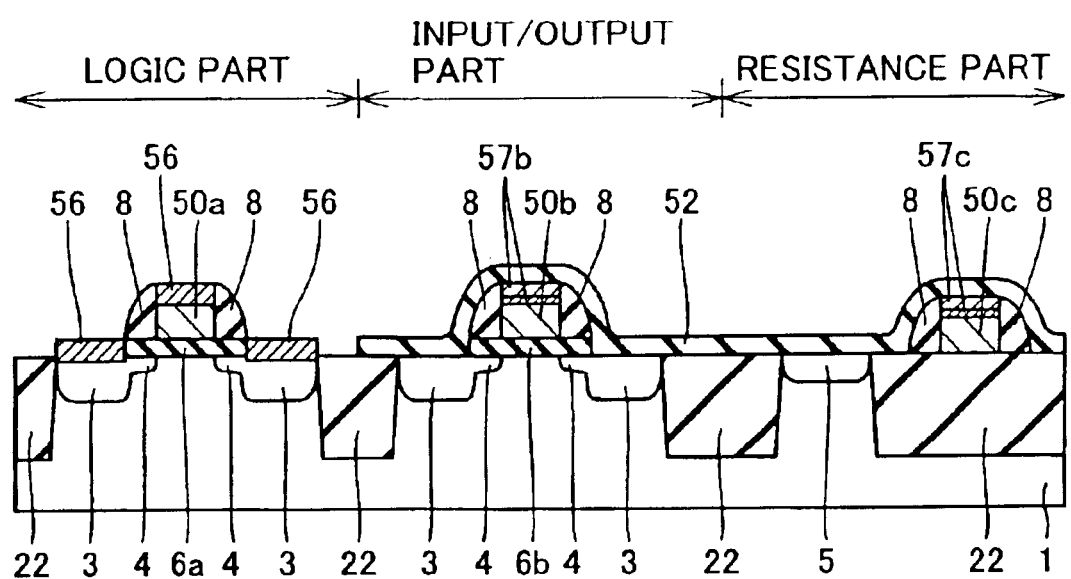

Then, a salicide process is carried out as shown in FIG. 36. A Co film 54 is formed by sputtering with a thickness of about 10 nm, and a TiN film 55 serving as a cap metal layer is formed on the Co film 54 by sputtering with a thickness of about 10 nm. RTA is performed in a nitrogen atmosphere at a temperature of about 500° C. for about 30 seconds. Thus, Si regions forming high-concentration impurity diffusion layers 3 and the polycrystalline silicon layer 50a of the logic part and Co cause silicification, to form thick CoSi films 56 on the logic part. Finally, RTA is performed at a temperature of about 850° C. for about 30 seconds, for phase-changing the CoSi films 56. Thus, phase-changed $CoSi_2$ films 56 are formed.

In this case, the phase-changed $CoSi_2$ films 56 formed on the logic part have a sheet resistance value of about 4 Ω/, while the sheet resistance values of the combinations of the polycrystalline silicon layers 50b and 50c and the Ti/TiN layers 57b and 57c formed on the input/output part and the resistance part reach about 10 Ω/.

According to the seventh embodiment, as hereinabove described, the input/output part and the resistance part can be controlled to arbitrary sheet resistance values while setting the logic part to a low sheet resistance value by forming the multilayer structures of the polycrystalline silicon layers 50a, 50b and 50c and the Ti/TiN layers 57a, 57b and 57c on the logic part, the input/output part and the resistance part respectively for obtaining resistance values necessary for the input/output part and the resistance part, thereafter removing the Ti/TiN layer 57a of the logic part through the resist film 53 and further forming the phase-changed $CoSi_2$ films 56 on the logic part through the salicide process.

Although the present invention has been described and illustrated in detail, it is clearly understood that the same is by way of illustration and example only and is not to be taken by way of limitation, the spirit and scope of the present invention being limited only by the terms of the appended claims.

For example, while Co is employed as the metal material forming the silicide films on the low-resistance side (the logic part) and the high-resistance side (the input/output part and the resistance part) in each of the aforementioned embodiments, the present invention is not restricted to this but a similar effect can be attained with another metal so far as the metal can form silicide by reacting with Si. For example, a metal such as Ti, V, Cr, Ni, Zr, Nb, Mo, Rh, Pd, Hf, Ta, W or Pt is employable. In this case, it is also possible to form different metal silicide films on the low-resistance side and the high-resistance side respectively. Ti, Co or Pd is suitable for forming a low-resistance silicide film, and V, Cr or Mo is suitable for forming high-resistance silicide films.

While Ti/TiN layers are employed as the metal layers formed on the polycrystalline silicon layers in the aforementioned seventh embodiment, the present invention is not restricted to this but other metal layers of W or Al may alternatively be employed, for example. In this case, the sheet resistance values of the input/output part and the resistance part can be easily controlled by controlling the materials for and the thicknesses of the employed metal layers.

While the logic part is shown as the region requiring a low sheet resistance value and the input/output part and the resistance part are shown as regions requiring high sheet resistance values in each of the aforementioned embodiments, the present invention is not restricted to this but is applicable to a general semiconductor device mixedly including regions requiring low and high sheet resistance values respectively.

While $B^+$, $As^+$, $BF_2^+$ or $P^+$ is employed as the impurity ion-implanted into the silicide films in the aforementioned fifth embodiment, the present invention is not restricted to this but another impurity is also employable so far as the same can deteriorate crystallinity of silicide films and increase the sheet resistance values thereof by ion implantation. For example, Ge or Si is employable.

While ions are implanted into the silicide films for deteriorating crystallinity of the silicide films and increasing the sheet resistance values thereof in the aforementioned fifth embodiment, the present invention is not restricted to this but a method other than ion implantation is also employable so far as the method can deteriorate the crystallinity of the silicide films and increase the sheet resistance values thereof.

What is claimed is:

1. A semiconductor device comprising:
    a first silicide film formed on a first silicon region; and
    a second silicide film, formed on a second silicon region, consisting of the same silicide material as said first silicide film and differing from said first silicide film in film quality to have a sheet resistance value different from that of said first silicide film.

2. The semiconductor device according to claim 1, wherein
    said second silicide film differs from said first silicide film in film quality due to introduction of an impurity, to have a higher sheet resistance value than said first silicide film.

3. The semiconductor device according to claim 1, wherein the second silicide film is formed on a gate electrode in the second silicon region.

4. The semiconductor device according to claim 1, wherein the first silicide film is a multilayer silicide film.

5. A semiconductor device comprising:
    a first silicon region and a first silicide film thereon; and
    a second silicon region and a second silicide film thereon, wherein the second silicide film is deteriorated in crystallinity to have a sheet resistance greater than that of said first silicide film.

6. The semiconductor device according to claim 5, wherein
said second silicide film is deteriorated in crystallinity due to introduction of an impurity.

7. The semiconductor device according to claim 6, wherein
said second silicide film is converted to an amorphous state due to introduction of said impurity.

8. The semiconductor device according to claim 6, wherein
said impurity includes at least one element selected from a group consisting of Ge, Si, B, As, P and $BF_2$.

9. The semiconductor device according to claim 6, wherein
said second silicide film contains Co.

* * * * *